US012777773B2

(12) United States Patent
Yamazaki

(10) Patent No.: US 12,777,773 B2
(45) Date of Patent: Oct. 27, 2026

(54) DISPLAY DEVICE AND ELECTRONIC DEVICE

(71) Applicant: SONY GROUP CORPORATION, Tokyo (JP)

(72) Inventor: Takashi Yamazaki, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 912 days.

(21) Appl. No.: 17/921,259

(22) PCT Filed: May 6, 2021

(86) PCT No.: PCT/JP2021/017379
§ 371 (c)(1),
(2) Date: Oct. 25, 2022

(87) PCT Pub. No.: WO2021/225139
PCT Pub. Date: Nov. 11, 2021

(65) Prior Publication Data

US 2023/0247864 A1 Aug. 3, 2023

(30) Foreign Application Priority Data

May 8, 2020 (JP) ................................ 2020-082762

(51) Int. Cl.
*H10K 59/12* (2023.01)
*H10K 59/121* (2023.01)
(Continued)

(52) U.S. Cl.
CPC ..... *H10K 59/1201* (2023.02); *H10K 59/1213* (2023.02); *H10K 59/1216* (2023.02); *H10K 59/123* (2023.02); *H10K 59/131* (2023.02)

(58) Field of Classification Search
CPC .............. H10K 59/12–1315; H10H 29/30–49; H10H 29/142; H01L 21/76895; H01L 21/76898; H01L 23/481
See application file for complete search history.

(56) References Cited

U.S. PATENT DOCUMENTS 12,453,243 B2 * 10/2025 Yang .................... H10K 77/111
2006/0261336 A1 * 11/2006 Ohnuma ............ H10D 86/0231
438/153

(Continued)

FOREIGN PATENT DOCUMENTS

JP 2004-006332 A 1/2004
JP 5141192 B2 2/2013

(Continued)

OTHER PUBLICATIONS

International Search Report and Written Opinion of PCT Application No. PCT/JP2021/017379, issued on Jul. 6, 2021, 11 pages of ISRWO.

*Primary Examiner* — Steven B Gauthier
*Assistant Examiner* — E. Rhett Cheek
(74) *Attorney, Agent, or Firm* — CHIP LAW GROUP

(57) ABSTRACT

A display device is provided with a drive substrate including a first surface and a second surface, and a plurality of light emitting elements provided on the first surface. The drive substrate is provided with a plurality of drive transistors provided on the second surface and drives the plurality of light emitting elements, respectively, a plurality of through electrodes that penetrates between the first surface and the second surface, and a plurality of connection units provided on the second surface, each of which connects a diffusion layer of each of the drive transistors and each of the through electrodes to each other. The connection unit is provided with a semiconductor layer or a semiconductor compound layer.

15 Claims, 17 Drawing Sheets

(51) Int. Cl.
*H10K 59/123* (2023.01)
*H10K 59/131* (2023.01)

(56) References Cited

U.S. PATENT DOCUMENTS

| | | | | |
|---|---|---|---|---|
| 2008/0308894 | A1* | 12/2008 | Tsai | H05K 1/0268 257/459 |
| 2010/0117072 | A1* | 5/2010 | Ofuji | H10K 59/122 257/E29.296 |
| 2014/0139569 | A1* | 5/2014 | Yamashita | G09G 3/3233 345/691 |
| 2014/0240370 | A1* | 8/2014 | Sakairi | G09G 3/3225 29/592 |
| 2015/0069363 | A1* | 3/2015 | Ota | H10K 59/1213 257/40 |
| 2016/0293643 | A1* | 10/2016 | Kim | H01L 21/26513 |
| 2020/0043963 | A1 | 2/2020 | Bu et al. | |
| 2021/0118976 | A1* | 4/2021 | Zhao | H10K 59/131 |

FOREIGN PATENT DOCUMENTS

| | | | |
|---|---|---|---|
| JP | 2014-194517 | A | 10/2014 |
| JP | 2015-055763 | A | 3/2015 |
| JP | 5870546 | B2 | 3/2016 |
| JP | 6031954 | B2 | 11/2016 |
| JP | 2017-037741 | A | 2/2017 |
| WO | 2017/138197 | A1 | 8/2017 |
| WO | 2017/187720 | A1 | 11/2017 |

* cited by examiner

DISPLAY DEVICE AND ELECTRONIC DEVICE

CROSS REFERENCE TO RELATED APPLICATIONS

This application is a U.S. National Phase of International Patent Application No. PCT/JP2021/017379 filed on May 6, 2021, which claims priority benefit of Japanese Patent Application No. JP 2020-082762 filed in the Japan Patent Office on May 8, 2020. Each of the above-referenced applications is hereby incorporated herein by reference in its entirety.

TECHNICAL FIELD

The present disclosure relates to a display device and an electronic device provided with the same.

BACKGROUND ART

A display device in which a plurality of light emitting elements such as organic light emitting diode (hereinafter referred to as "OLED") elements is arranged on a substrate spontaneously emits light and thus has a characteristic of low power consumption, so that this is expected to be applied to various electric devices.

In the above-described display device, a technology has been proposed in which a plurality of pixel circuits that drives a plurality of light emitting elements, respectively, and their peripheral circuits are formed on the same single crystal silicon substrate using a silicon semiconductor microprocess, thereby achieving both miniaturization and high definition of the display device (refer to, for example, Patent Documents 1 and 2). A small display device manufactured by such a technology is expected to be applied to an electronic view finder and the like.

Patent Document 3 proposes, as a display device using a silicon semiconductor microprocess, a display device having a structure in which a plurality of light emitting units (light emitting elements) 20 is provided on a first surface of a Si layer (silicon substrate) 13A, and a plurality of drive transistors Tr2 for driving the above-described plurality of light emitting units (light emitting elements) 20, respectively, is provided on a second surface of the Si layer 13A.

CITATION LIST

Patent Document

Patent Document 1: Japanese Patent No. 5870546
Patent Document 2: Japanese Patent No. 6031954
Patent Document 3: Japanese Patent Application Laid-Open No. 2014-194517

SUMMARY OF THE INVENTION

Problems to be Solved by the Invention

However, in the technology disclosed in Patent Document 3, since a through electrode 13V and a source/drain region (diffusion layer) 132A of a drive transistor Tr2 are connected to each other by wiring 121 (refer to FIG. 1 and the like of Patent Document 3), there is a problem that a degree of freedom in routing wiring other than the wiring 121 is decreased.

An object of the present disclosure is to provide a display device capable of suppressing a decrease in degree of freedom of wiring routing, and an electronic device provided with the same.

Solutions to Problems

In order to solve the above-described problem, a first disclosure is a display device provided with:

a drive substrate including a first surface and a second surface; and a plurality of light emitting elements provided on the first surface, in which the drive substrate is provided with:

a plurality of drive transistors provided on the second surface and drives the plurality of light emitting elements, respectively;

a plurality of through electrodes that penetrates between the first surface and the second surface; and a plurality of connection units provided on the second surface, each of which connects a diffusion layer of each of the drive transistors and each of the through electrodes to each other, and the connection unit is provided with a semiconductor layer or a semiconductor compound layer.

A second disclosure is an electronic device provided with the display device of the first disclosure.

MODE FOR CARRYING OUT THE INVENTION

Embodiments of the present disclosure are described in the following order. Note that, the same or corresponding portions are assigned with the same reference sign throughout all the drawings of the following embodiments.

1. First Embodiment
1-1. Configuration of Display Device
1-2. Method of Manufacturing Display Device
1-3. Action and Effect
2. Second Embodiment
2-1. Configuration of Display Device
2-2. Method of Manufacturing Display Device
2-3. Action and Effect
3. Variation
4. Application Example

1. First Embodiment

[1-1. Configuration of Display Device]

Figure 1:
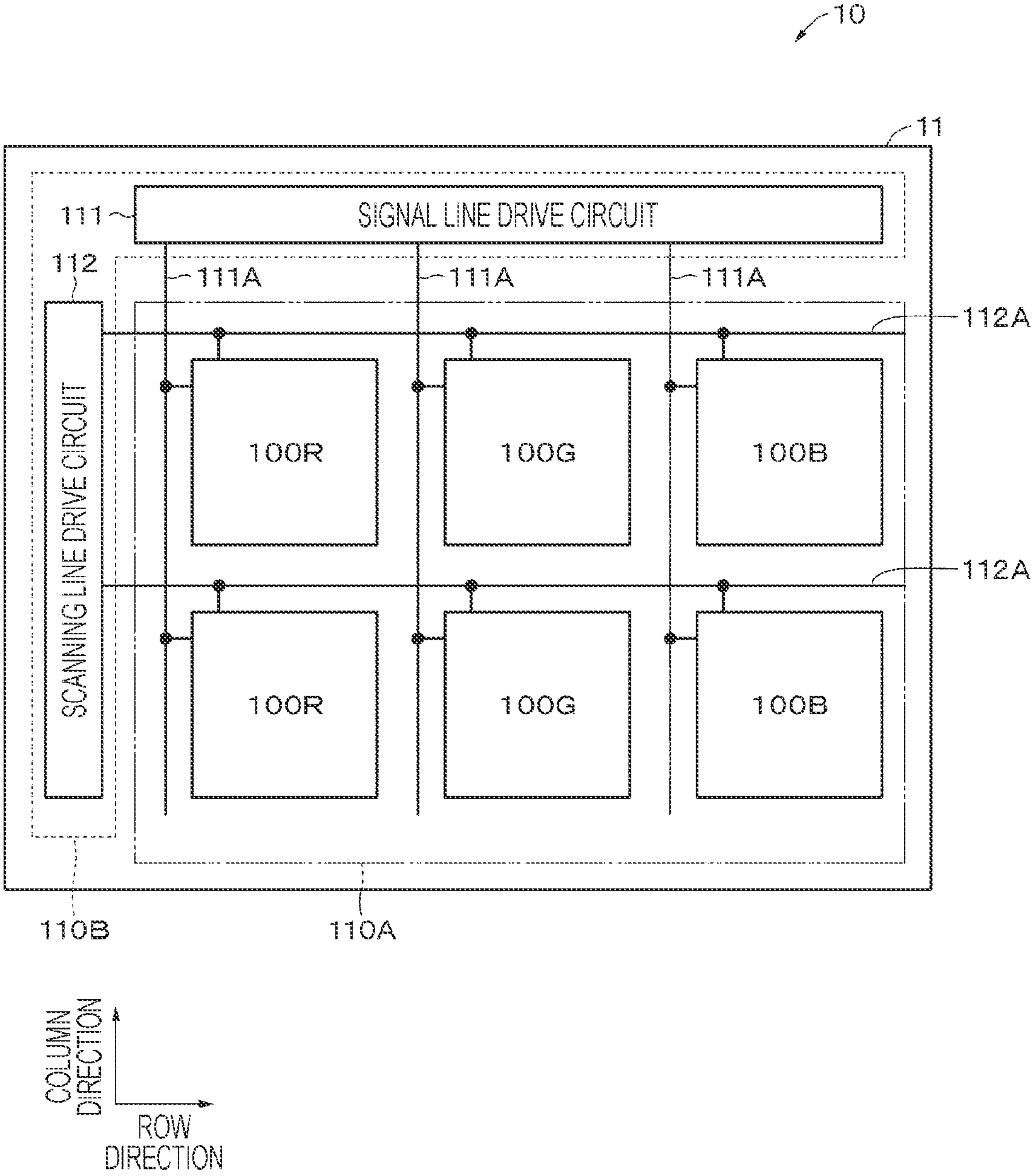
FIG. 1 is a schematic diagram illustrating an example of an entire configuration of a display device according to a first embodiment of the present disclosure.

FIG. 1 is a schematic diagram illustrating an example of an entire configuration of a display device 10 according to a first embodiment of the present disclosure. The display device 10 is a so-called organic electro luminescence (EL) display device. The display device 10 is suitable for use in various electronic devices, and includes a display region 110A and a peripheral region 110B provided on a peripheral edge of the display region 110A.

In the display region 110A, a plurality of subpixels 100R, a plurality of subpixels 100G, and a plurality of subpixels 100B are arranged in a matrix. The subpixel 100R displays red, the subpixel 100G displays green, and the subpixel 100B displays blue.

Note that, in the following description, the subpixels 100R, 100G, and 100B are referred to as subpixels 100 unless especially distinguished. Furthermore, in the following description, a row direction means a row direction of the arrangement in matrix described above, and a column direction means a column direction of the arrangement in matrix described above.

Columns of the subpixels 100R, columns of the subpixels 100G, and columns of the subpixels 100B displaying the same color are repetitively arranged in the row direction. A combination of three subpixels 100R, 100G, and 100B arranged in the row direction forms one pixel.

Furthermore, in the display region 110A, a plurality of signal lines 111A extended in the column direction and a plurality of scanning lines 112A extended in the row direction are provided. The subpixel 100 is provided corresponding to each intersection of each signal line 111A and each scanning line 112A. Each signal line 111A is connected to a signal line drive circuit 111, and each scanning line 112A is connected to a scanning line drive circuit 112.

In the peripheral region 110B, the signal line drive circuit 111 and the scanning line drive circuit 112, which are drivers for video display, are provided. The signal line drive circuit 111 supplies a signal voltage of a video signal corresponding to luminance information supplied from a signal supply source (not illustrated) to the subpixel 100 selected via the signal line 111A. The scanning line drive circuit 112 includes a shift register and the like that sequentially shifts (transfers) a start pulse in synchronization with an input clock pulse. The scanning line drive circuit 112 scans the subpixels 100 row by row when the video signal is written to each subpixel 100, and sequentially supplies a scanning signal to each scanning line 112A.

Figure 2:
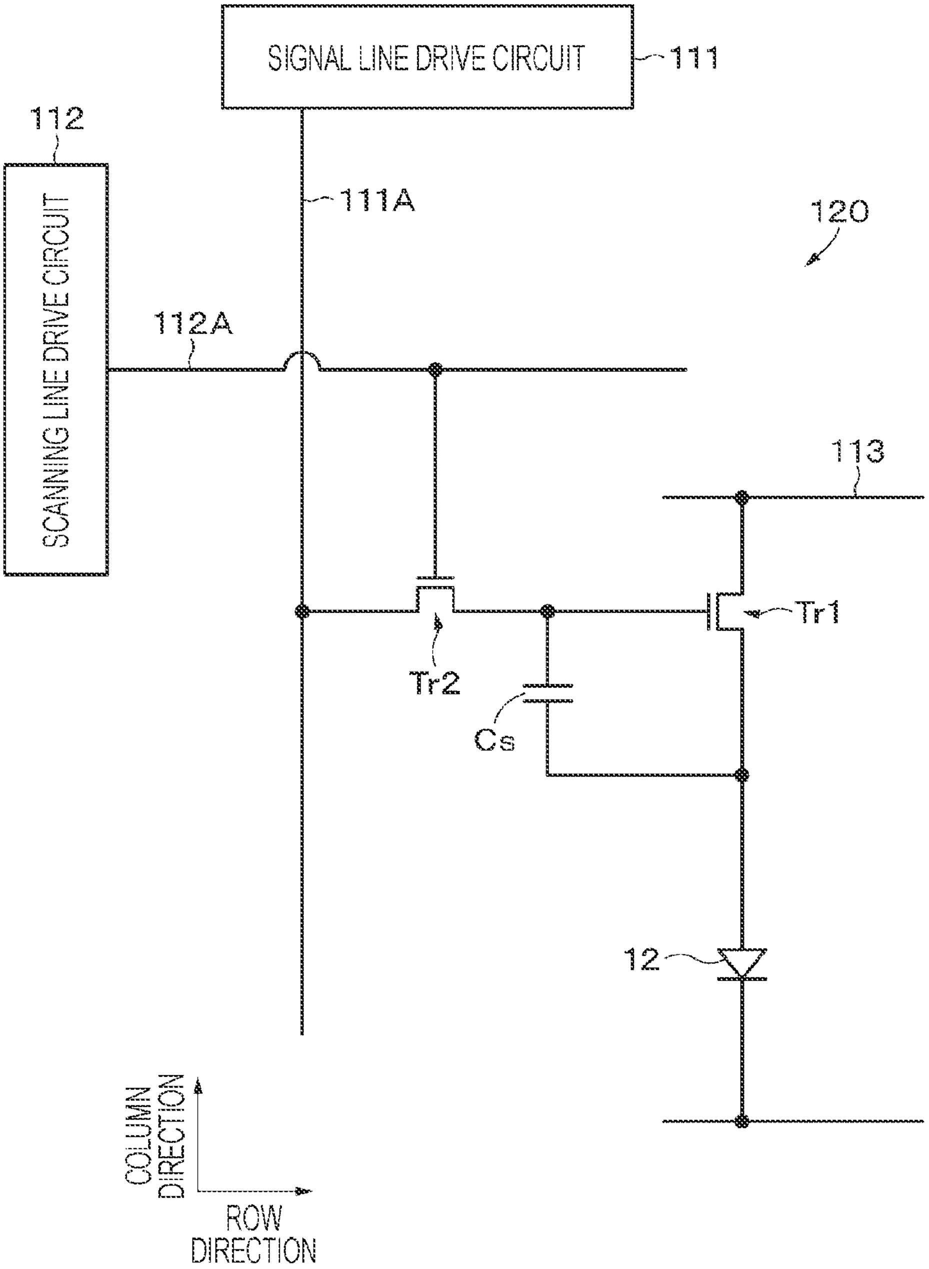
FIG. 2 is a circuit diagram illustrating an example of a configuration of a pixel circuit.

FIG. 2 is a circuit diagram illustrating an example of a configuration of a pixel circuit 120 that drives the subpixel 100. In the display region 110A, a plurality of pixel circuits 120 is provided corresponding to the plurality of subpixels 100, respectively. The pixel circuit 120 is an active pixel circuit. The pixel circuit 120 is configured to be able to correct a threshold voltage Vth of a drive transistor Tr1 and to control light emission of a light emitting element 12. As a method of correcting the threshold voltage Vth and controlling the light emission of the light emitting element 12, for example, a method disclosed in Japanese Patent No. 5141192 may be used.

The pixel circuit 120 is provided with the drive transistor Tr1, a write transistor Tr2, and a capacitive element (capacitor) Cs. One source/drain region (diffusion layer) of the drive transistor Tr1 is connected to a power supply line 113, and is set to prescribed potential by a power supply line drive circuit (not illustrated). The other source/drain region (diffusion layer) of the drive transistor Tr1 is connected to a first electrode of the light emitting element 12 and is connected to one electrode of the capacitive element Cs. A gate electrode of the drive transistor Tr1 is connected to one source/drain region of the write transistor Tr2 and is connected to the other electrode of the capacitive element Cs.

The other source/drain region of the write transistor Tr2 is connected to the signal line 111A, and the video signal from the signal line drive circuit 111 is supplied thereto. A gate electrode of the write transistor Tr2 is connected to the scanning line 112A, and the scanning signal from the scanning line drive circuit 112 is supplied thereto.

The display device 10 is, for example, a microdisplay in which self light emitting elements such as OLED elements or Micro-OLED elements are formed in an array. The display device 10 is suitably used as a display device for virtual reality (VR), mixed reality (MR), or augmented reality (AR), an electronic view finder (EVF), a small projector or the like.

Figure 3:
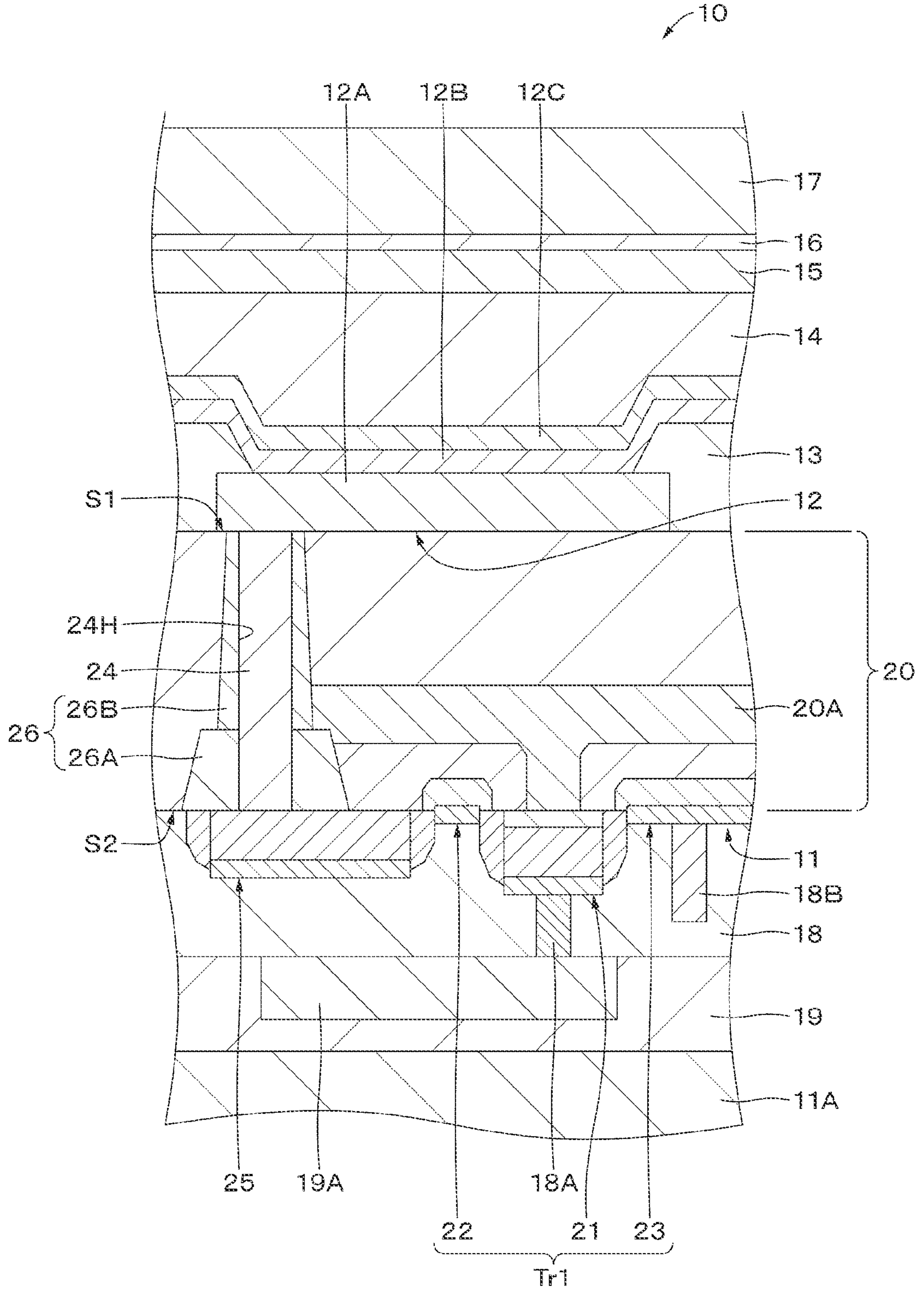
FIG. 3 is a cross-sectional view illustrating an example of a configuration of the display device according to the first embodiment of the present disclosure.
Figure 4:
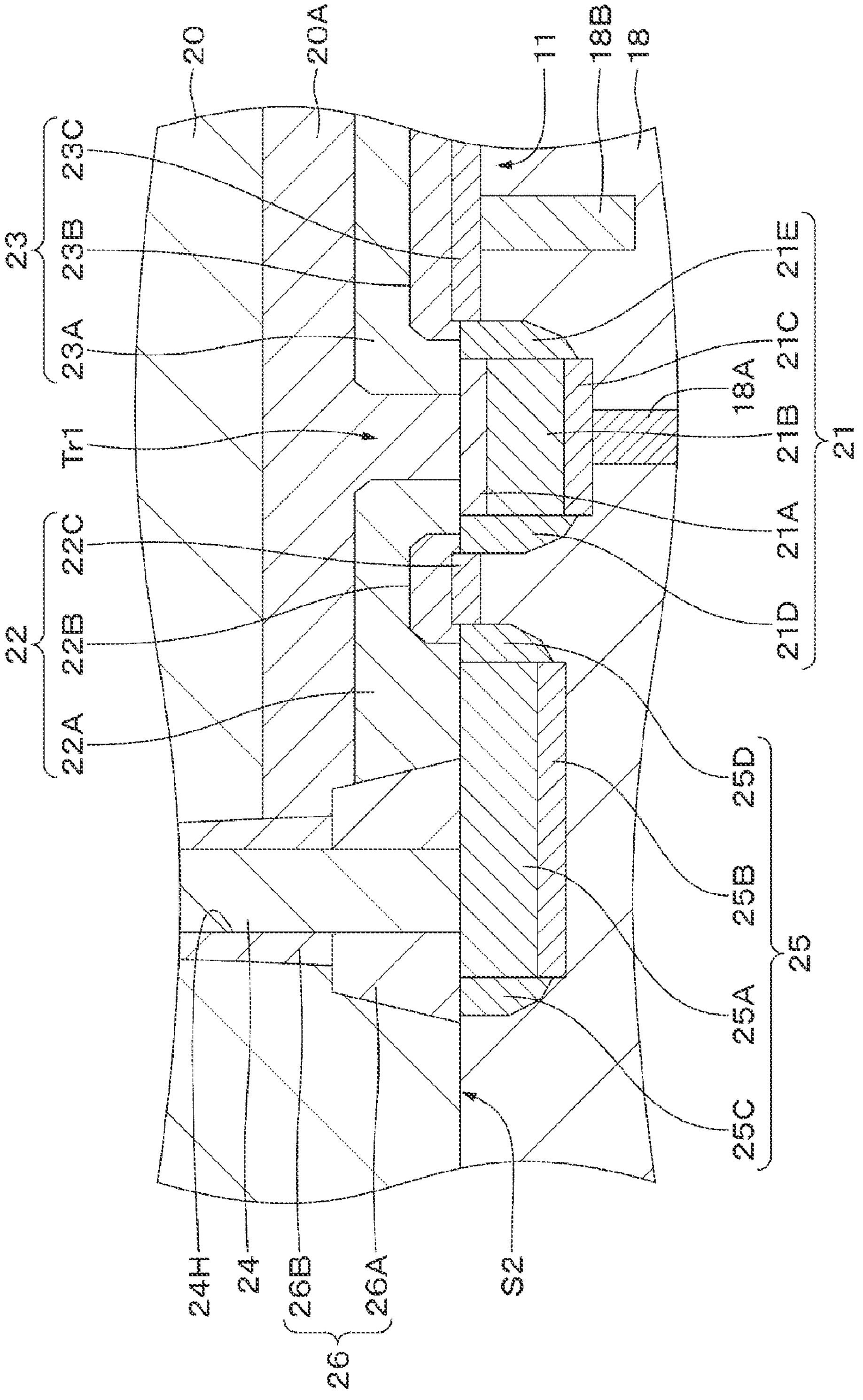
FIG. 4 is a partially enlarged cross-sectional view of FIG. 3.

FIG. 3 is a cross-sectional view illustrating an example of a configuration of the display device 10 according to the first embodiment of the present disclosure. FIG. 4 is a partially enlarged cross-sectional view of FIG. 3. The display device 10 is a top emission-type display device, and is provided with a drive substrate (first substrate) 11 including a first surface S1 and a second surface S2, an insulating layer 13 and a plurality of light emitting elements 12 provided on the first surface S1 of the drive substrate 11, a protective layer 14 provided on the plurality of light emitting elements 12, a color filter 15 provided on the protective layer 14, a filling resin layer 16 provided on the color filter 15, and a counter substrate (second substrate) 17 provided on the filling resin layer 16. Moreover, the display device 10 is provided with an insulating layer 18 provided on the second surface S2 of the drive substrate 11, a multilayer wiring layer 19 provided on the insulating layer 18, and a support substrate 11A provided on the multilayer wiring layer 19. Note that, a side of the counter substrate 17 is a top side, and a side of the drive substrate 11 is a bottom side.

(Drive Substrate)

The drive substrate 11 is a so-called backplane. The drive substrate 11 is obtained by forming the pixel circuit 120 on the second surface S2 of a semiconductor substrate 20, which is a main body of the drive substrate 11. The pixel circuit 120 is further provided with a through electrode 24 and a connection unit 25 in addition to the drive transistor Tr1, the write transistor Tr2, and the capacitive element (capacitor) Cs described above. Note that, in FIGS. 3 and 4, the write transistor Tr2 and the capacitive element Cs are not illustrated.

The semiconductor substrate 20, which is the main body of the drive substrate 11, is preferably a silicon substrate. The silicon substrate includes, for example, single crystal silicon or polysilicon (polycrystalline silicon).

(Drive Transistor)

The drive transistor Tr1 drives the light emitting element 12. A plurality of drive transistors Tr1 is provided on the second surface S2 of the drive substrate 11. The drive transistor Tr1 is a P-type metal-oxide-semiconductor field-effect transistor (MOSFET), for example. The drive transistor Tr1 is provided with a gate electrode 21, a source/drain region 22, which is a first diffusion layer, and a source/drain region 23, which is a second diffusion layer. A channel of the drive transistor Tr1 includes, for example, single crystal silicon or polysilicon.

The gate electrode 21 is provided on a region between the source/drain region 22 and the source/drain region 23 provided separate from each other. The gate electrode 21 is provided with, for example, a gate insulating layer 21A provided on the second surface S2 of the drive substrate 11, a polysilicon layer 21B provided on the gate insulating layer 21A, and a silicide layer 21C provided on the polysilicon layer 21B. The gate electrode 21 may be further provided with sidewalls 21D and 21E on both sides thereof.

The gate insulating layer 21A includes, for example, a silicon oxide layer. The polysilicon layer 21B is, for example, a $P^+$-type polysilicon layer. Here, the $P^+$-type polysilicon layer refers to a polysilicon layer doped with P-type impurities at a higher concentration than that of a $P^-$-type diffusion region 22A.

The silicide layer 21C includes a compound of silicon and metal. Metal includes, for example, at least one selected from a group including molybdenum (Mo), tungsten (W), titanium (Ti), cobalt (Co), and nickel (Ni). The sidewalls 21D and 21E include a silicon oxide layer.

The semiconductor substrate 20 includes an N-type semiconductor well region (hereinafter, referred to as an "N-type well region") 20A on the second surface S2 side. The source/drain regions 22 and 23 are P-type semiconductor regions provided in the N-type well region 20A. The source/drain region 22 and the source/drain region 23 are provided separate from each other on the second surface S2 side of the semiconductor substrate 20.

The source/drain region 22 is provided with the $P^-$-type diffusion region (first diffusion region) 22A and a $P^+$-type diffusion region (second diffusion region) 22B. Here, the $P^-$-type diffusion region 22B refers to a low-concentration impurity region doped with the P-type impurities at a lower concentration than that of the $P^+$-type diffusion region 22A. In contrast, the $P^+$-type diffusion region 22B refers to a high-concentration impurity diffusion region doped with the P-type impurities at a higher concentration than that of the $P^-$-type diffusion region 22A.

The $P^+$-type diffusion region 22B is provided in the $P^-$-type diffusion region 22A. The $P^+$-type diffusion region 22B is located on a surface side of the $P^-$-type diffusion region 22A (the second surface S2 side of the semiconductor substrate 20). At least a part of the $P^+$-type diffusion region 22B is located in a region between the gate electrode 21 and the connection unit 25.

The $P^+$-type diffusion region 23B is provided in the $P^-$-type diffusion region 23A. The $P^+$-type diffusion region 23B is located on a surface side of the $P^-$-type diffusion region 23A (the second surface S2 side of the semiconductor substrate 20).

The source/drain region 22 is provided with a silicide layer 22C on a surface of the $P^+$-type diffusion region 22B. The silicide layer 22C is provided in a portion between the gate electrode 21 and the connection unit 25 in the second surface S2 of the drive substrate 11. As a material of the silicide layer 22C, a material similar to that of the silicide layer 21C of the gate electrode 21 may be exemplified. The silicide layer 22C may include a material similar to that of the silicide layer 21C of the gate electrode 21, or may include a material different from that of the silicide layer 21C of the gate electrode 21.

The source/drain region 23 is provided with a silicide layer 23C on a surface of the $P^+$-type diffusion region 23B. As a material of the silicide layer 23C, a material similar to that of the silicide layer 21C of the gate electrode 21 may be exemplified. The silicide layer 23C may include a material similar to that of the silicide layer 21C of the gate electrode 21, or may include a material different from that of the silicide layer 21C of the gate electrode 21.

(Through Electrode)

The through electrode 24 connects the light emitting element 12 and the connection unit 25 to each other. The through electrode 24 penetrates a space between the first surface S1 and the second surface S2 of the drive substrate 11. The through electrode 24 has, for example, a pillar shape. The through electrode 24 includes, for example, a conductive material such as polysilicon, single crystal silicon, or metal. In order to suppress a leakage current between the through electrode 24 and the drive substrate 11, the through electrode 24 preferably includes polysilicon or single crystal silicon. As metal, tungsten (W) is preferable.

(Isolation Region)

The drive substrate 11 may be provided with an isolation region 26, and the through electrode 24 may be provided in the isolation region 26. Specifically, the isolation region 26 may include a contact hole 24H, and the through electrode 24 may be provided in the contact hole 24H. The isolation region 26 isolates the through electrode 24 from the semiconductor substrate 20. This makes it possible to suppress the leakage current from flowing between the through electrode 24 and the drive substrate 11. The isolation region 26 includes, for example, an oxide layer such as a silicon oxide layer.

The isolation region 26 is provided with a first isolation region 26A and a second isolation region 26B. The first isolation region 26A suppresses the leakage current flowing between the through electrode 24 and the source/drain region 22. The first isolation region 26A is provided adjacent to the source/drain region 22 on the second surface S2 side of the drive substrate 11. The first isolation region 26A may be an inter-element isolation (shallow trench isolation) region that isolates the drive transistor Tr1 from other elements provided on the second surface S2 of the drive substrate 11. A width of the first isolation region 26A may be wider than a width of the second isolation region 26B.

The second isolation region 26B suppresses the leakage current flowing between a portion deeper than the source/drain region 22 of the semiconductor substrate 20 and the through electrode 24. The second isolation region 26B has, for example, a pillar shape. The second isolation region 26B is extended from the first surface S1 of the semiconductor substrate 20 to the first isolation region 26A, and is coupled to the first isolation region 26A.

(Connection Unit)

A plurality of connection units 25 is provided on the second surface S2 of the drive substrate 11. The connection unit 25 connects the source/drain region (diffusion layer) 22 of the drive transistor Tr1 and the through electrode 24 to each other. Furthermore, the connection unit 25 serves as an etching stopper layer when the contact hole 24H is formed by etching.

The connection unit 25 is provided with, for example, a polysilicon layer 25A provided on the second surface S2 of the drive substrate 11, and a silicide layer 25B provided on the polysilicon layer 25A. Since the connection unit 25 is provided with the silicide layer 25B, parasitic resistance between the drive transistor Tr1 and the through electrode 24 may be reduced. Note that, the silicide layer 25B is provided as necessary, and it is possible that this is not provided. The connection unit 25 may be further provided with sidewalls 25C and 25D on both sides thereof.

The polysilicon layer 25A is an example of a semiconductor layer. The polysilicon layer 25A is, for example, a $P^+$-type polysilicon layer. As a material of the polysilicon layer 25A, a material similar to that of the polysilicon layer 21B of the gate electrode 21 may be exemplified. The polysilicon layer 25A may include a material similar to that of the polysilicon layer 21B of the gate electrode 21, or may include a material different from that of the polysilicon layer 21B of the gate electrode 21.

The silicide layer 25B is an example of a semiconductor compound layer. As a material of the silicide layer 25B, a material similar to that of the silicide layer 21C of the gate electrode 21 may be exemplified. The silicide layer 25B may include a material similar to that of the silicide layer 21C of the gate electrode 21, or may include a material different from that of the silicide layer 21C of the gate electrode 21. The sidewalls 25C and 25D include, for example, a silicon oxide layer.

In order to suppress the leakage current flowing between the connection unit 25 and the semiconductor substrate 20, the connection unit 25 is preferably provided in a region including the source/drain region 22 and the first isolation region 26A. That is, the connection unit 25 is preferably in contact only with the source/drain region 22 and the first isolation region 26A in the first surface S1 of the semiconductor substrate 20.

(Insulating Layer)

The insulating layer 18 is provided on the second surface S2 of the drive substrate 11. The insulating layer 18 is provided with a conductive plug 18A, a conductive plug 18B and the like. The conductive plug 18A connects wiring 19A of the multilayer wiring layer 19 and the silicide layer 21C of the gate electrode 21 to each other. The conductive plug 18B connects a power supply line (not illustrated) and the source/drain region 23 to each other.

(Multilayer Wiring Layer)

The multilayer wiring layer 19 is provided on the insulating layer 18. The multilayer wiring layer 19 is provided with a plurality of wiring layers such as the wiring 19A.

(Support Substrate)

The support substrate 11A is provided on the multilayer wiring layer 19. The support substrate 11A supports the drive substrate 11. The support substrate 11A includes, for example, silicon.

(Light Emitting Element)

A plurality of light emitting elements 12 is arranged in a matrix on one principal surface of the drive substrate 11. The light emitting element 12 is a white OLED element or a white Micro-OLED (MOLED) element. In the first embodiment, as a coloring method in the display device 10, a method using the white OLED element and the color filter 15 is used. Note that, the coloring method is not limited thereto, and an RGB coloring method and the like may be used. Furthermore, a monochromatic filter may be used.

The light emitting element 12 is obtained by stacking a first electrode (for example, an anode) 12A, an organic layer 12B, and a second electrode (for example, a cathode) 12C in this order on the first surface S1 of the drive substrate 11.

(First Electrode)

The first electrode 12A is provided so as to be electrically isolated for each subpixel 100. The first electrode 12A also serves as a reflection layer, and preferably includes a metal layer having a reflectance as high as possible and a work function as large as possible in order to enhance light emission efficiency. As a component of the metal layer, for example, at least one of a simple substance and an alloy of metal elements such as chromium (Cr), gold (Au), platinum (Pt), nickel (Ni), copper (Cu), molybdenum (Mo), titanium (Ti), tantalum (Ta), aluminum (Al), magnesium (Mg), iron (Fe), tungsten (W), or silver (Ag) may be used. As a specific example of the alloy, this may include a stacked film of a plurality of metal layers.

(Second Electrode)

The second electrode 12C is provided as an electrode common to all the subpixels 100 in the display region 110A. The second electrode 12C is a transparent electrode having transmissivity to light generated in the organic layer 12B. Here, the transparent electrode also includes a semi-transmissive reflection layer. The second electrode 12C includes, for example, metal or metal oxide. As the metal, for example, at least one of a simple substance and an alloy of metal elements such as aluminum (Al), magnesium (Mg), calcium (Ca), or sodium (Na) may be used. As the alloy, for example, an alloy of magnesium (Mg) and silver (Ag) (MgAg alloy), or an alloy of aluminum (Al) and lithium (Li) (AlLi alloy) is suitable. As the metal oxide, for example, a mixture of indium oxide and tin oxide (ITO), a mixture of indium oxide and zinc oxide (IZO), or metal oxide such as zinc oxide (ZnO) may be used.

(Insulating Layer)

The insulating layer 13 is for electrically isolating the first electrode 12A for each subpixel 100. The insulating layer 13 is provided between the first electrodes 12A and covers a peripheral edge of the first electrode 12A. More specifically, the insulating layer 13 includes an opening in a portion corresponding to each first electrode 12A, and covers from a peripheral edge of an upper surface of the first electrode 12A (a counter surface to the second electrode 12C) to a side surface (end face) of the first electrode 12A.

The insulating layer 13 includes, for example, an organic material or an inorganic material. Examples of the organic material include polyimide, acrylic resin or the like, for example. As the inorganic material, for example, silicon oxide, silicon nitride, silicon oxynitride, aluminum oxide or the like may be used.

(Organic Layer)

The organic layer 12B is provided between the first electrode 12A and the second electrode 12C. The organic layer 12B is provided as an organic layer common to all the subpixels 100 in the display region 110A. The organic layer 12B has, for example, a configuration in which a hole injection layer, a hole transport layer, a light emitting layer, and an electron transport layer are stacked in this order from the side of the first electrode 12A. Note that, the configuration of the organic layer is not limited thereto, and layers other than the light emitting layer are provided as necessary.

The hole injection layer is a buffer layer for enhancing hole injection efficiency into the light emitting layer and suppressing leakage. The hole transport layer is for enhancing hole transport efficiency to the light emitting layer. The light emitting layer generates light by recombination of electrons and holes when an electric field is applied. The electron transport layer is for enhancing electron transport efficiency to the light emitting layer. An electron injection layer may be provided between the electron transport layer and the second electrode 12C. The electron injection layer is for enhancing electron injection efficiency.

(Protective Layer)

The protective layer 14 is for blocking the light emitting element 12 from outside air, and suppressing moisture infiltration from an external environment into the light emitting element 12. Furthermore, in a case where the second electrode 12C includes a metal layer, the protective layer 14 may also have a function of suppressing oxidation of the metal layer.

The protective layer 14 includes, for example, an inorganic material having low hygroscopicity. The inorganic material includes, for example, at least one of silicon oxide (SiO), silicon nitride (SiN), silicon oxynitride (SiNO), titanium oxide (TiO), or aluminum oxide (AlO). The protective layer 14 may have a single layer structure, but may have a multilayer structure in a case where a thickness is increased. This is for alleviating an internal stress in the protective layer 14. The protective layer 14 may include a polymer resin. The polymer resin includes at least one of a thermosetting resin or an ultraviolet curable resin.

(Color Filter)

The color filter 15 is, for example, an on-chip color filter (OCCF). The color filter 15 is provided with, for example, a red filter, a green filter, and a blue filter. The red filter, the green filter, and the blue filter are provided so as to be opposed to the light emitting element 12 of the subpixel 100R, the light emitting element 12 of the subpixel 100G, and the light emitting element 12 of the subpixel 100B, respectively. Therefore, white light emitted from each light emitting element 12 in the subpixel 100R, the subpixel 100G, and the subpixel 100B is transmitted through the red filter, the green filter, and the blue filter described above, so that red light, green light, and blue light are emitted from a display surface. Furthermore, a light shielding layer (not illustrated) may be provided between the color filters of the respective colors, that is, in a region between the subpixels 100. Note that, the color filter 15 is not limited to the on-chip color filter, and may be provided on one principal surface of the counter substrate 17.

(Filling Resin Layer)

The filling resin layer 16 has a function as a bonding layer that bonds the color filter 15 to the counter substrate 17. The filling resin layer 16 includes, for example, at least one of a thermosetting resin or an ultraviolet curable resin.

(Counter Substrate)

The counter substrate 17 is provided such that one surface of the counter substrate 17 is opposed to the first surface S1 of the drive substrate 11 provided with a plurality of light emitting elements 12. The counter substrate 17 seals the light emitting element 12, the color filter 15 and the like together with the filling resin layer 16. The counter substrate 17 includes a material such as glass transparent to each color light emitted from the color filter 15.

[1-2. Method of Manufacturing Display Device]

Hereinafter, an example of a method of manufacturing the display device 10 according to the first embodiment of the present disclosure is described with reference to FIGS. 5A, 5B, 5C, 5D, 5E, 5F, 5G. 5H, 5I, 5J, and 5K.

Figure 5A:
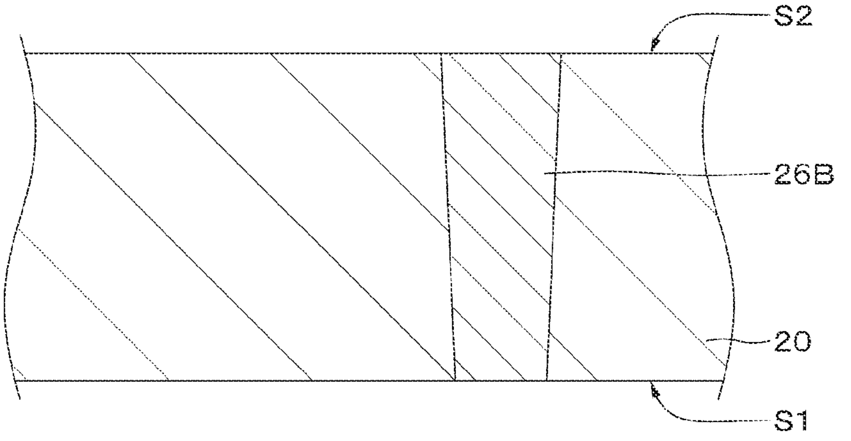
FIG. 5A is a step diagram for illustrating an example of a method of manufacturing the display device.
Figure 5B:
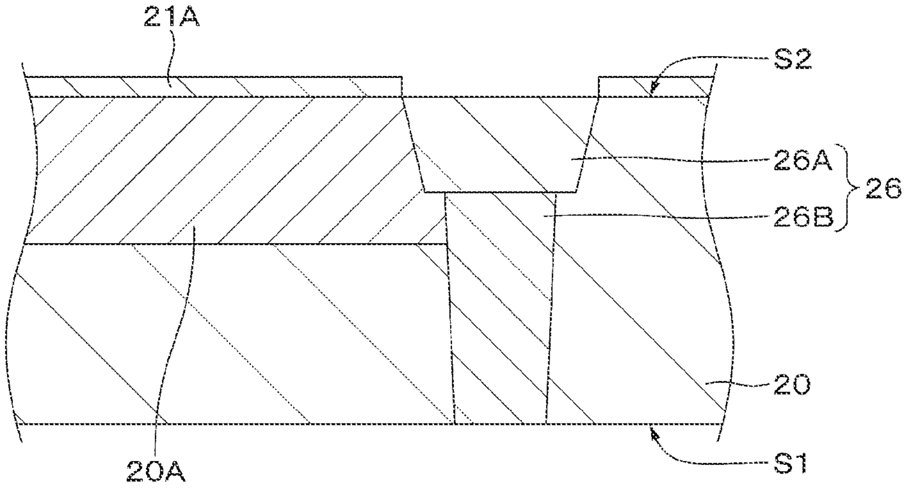
FIG. 5B is a step diagram for illustrating an example of the method of manufacturing the display device.
Figure 5C:
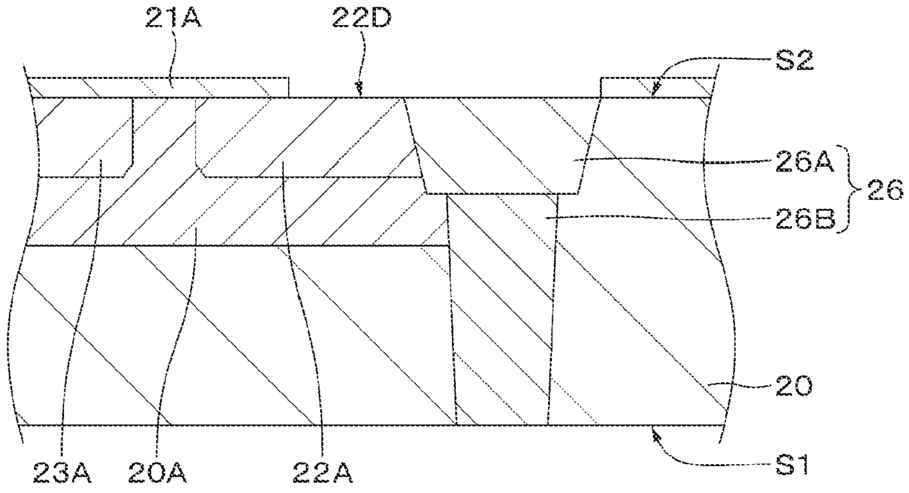
FIG. 5C is a step diagram for illustrating an example of the method of manufacturing the display device.

First, a plurality of second isolation regions 26B that penetrates the semiconductor substrate 20 from the first surface S1 to the second surface S2 is formed in the semiconductor substrate 20 (refer to FIG. 5A). Next, after the first isolation region 26A is formed in an upper portion of each second isolation region 26B (end on the second surface S2 side of the semiconductor substrate 20), ions are implanted into the second surface S2 of the semiconductor substrate 20 to form a plurality of N-type well regions 20A. After the N-type well region 20A is formed, for example, the second surface S2 of the semiconductor substrate 20 is oxidized to form the gate insulating layer 21A on the second surface S2 of the semiconductor substrate 20 (refer to FIG. 5B).

Next, a plurality of $P^-$-type diffusion regions 22B and a plurality of $P^-$-type diffusion regions 23B are formed by ion-implanting P-type impurities such as boron into each N-type well region 20A. Next, the gate insulating layer 21A is partially removed, and a surface exposing portion 22D in which the surface of the diffusion region 22A is exposed is formed in a portion adjacent to the first isolation region 26A out of the surface of each diffusion region 22A (refer to FIG. 5C).

Figure 5D:
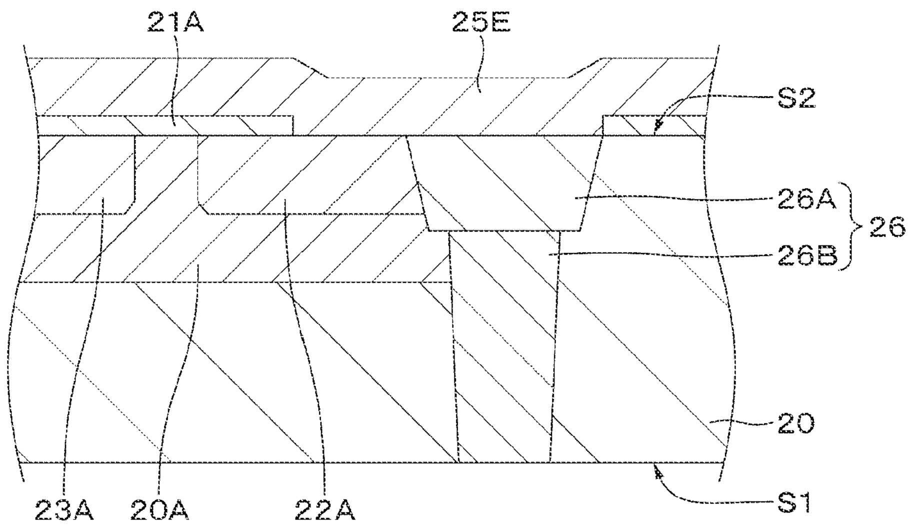
FIG. 5D is a step diagram for illustrating an example of the method of manufacturing the display device.
Figure 5E:
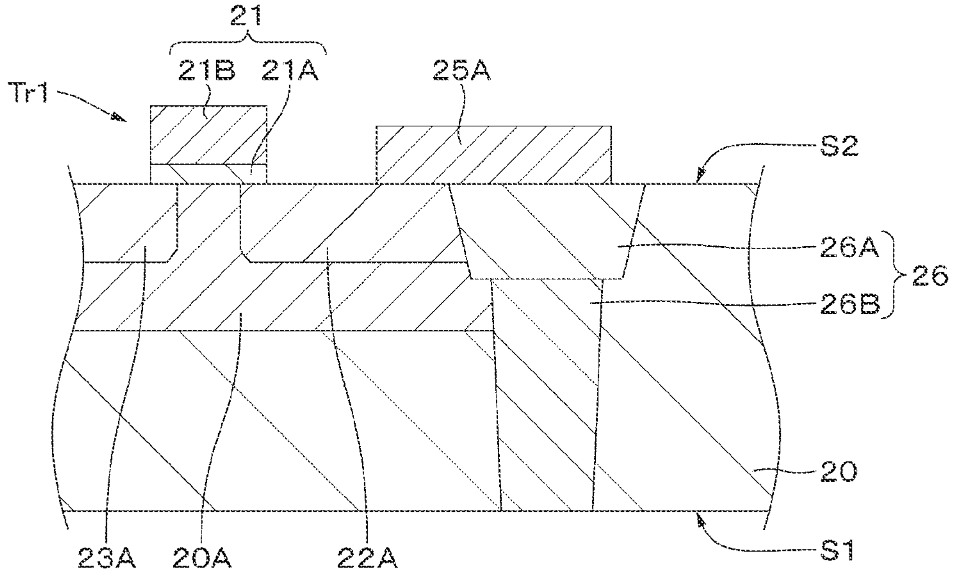
FIG. 5E is a step diagram for illustrating an example of the method of manufacturing the display device.
Figure 5F:
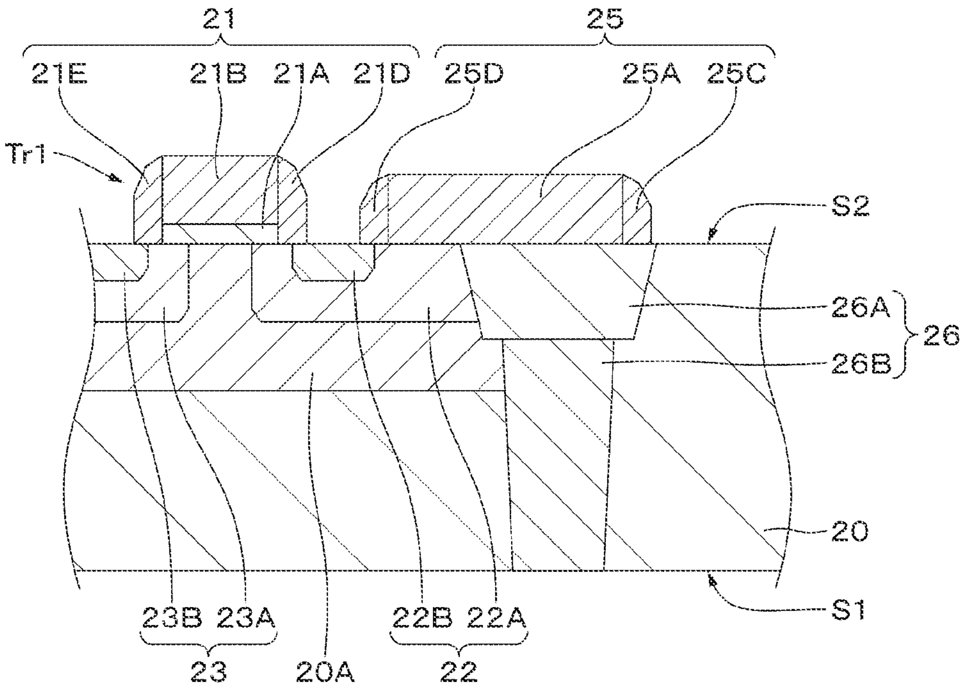
FIG. 5F is a step diagram for illustrating an example of the method of manufacturing the display device.
Figure 5G:
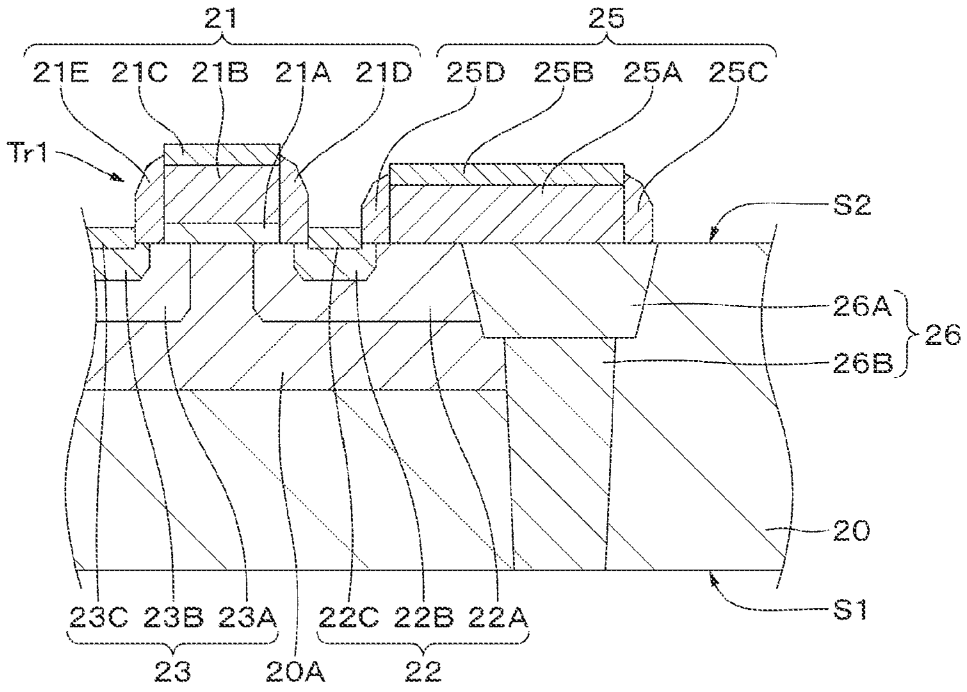
FIG. 5G is a step diagram for illustrating an example of the method of manufacturing the display device.

Next, a polysilicon layer 25E is formed on the second surface S2 of the semiconductor substrate 20 by, for example, chemical vapor deposition (CVD) (refer to FIG. 5D). Next, the polysilicon layer 25E is patterned by, for example, photolithography and etching to form a plurality of gate electrodes 21 and the polysilicon layer 25A on the second surface S2 of the semiconductor substrate 20 (refer to FIG. 5E).

Next, after an oxide layer is formed on the semiconductor substrate 20 by, for example, CVD, the above-described oxide layer is etched back to form the sidewalls 21D and 21E on each gate electrode 21, and form the sidewalls 25C and 25D on the polysilicon layer 25A. The sidewalls 25C and 25D and the polysilicon layer 25A form the connection unit 25.

Thereafter, the P-type impurities such as boron are implanted into the polysilicon layer 21B of each gate electrode 21, the polysilicon layer 25A of each connection unit 25, each $P^-$-type diffusion region 22B, and each $P^-$-type diffusion region 23B. Therefore, the polysilicon layer 21B of each gate electrode 21 and the polysilicon layer 25A of each connection unit 25 become the $P^+$-type polysilicon layers. Furthermore, the $P^+$-type diffusion region 22B and the $P^+$-type diffusion region 23B are formed in each $P^-$-type diffusion region 22A and each $P^-$-type diffusion region 23A, respectively (refer to FIG. 5F). At that time, the P-type impurities are implanted at a higher concentration than that at a step of forming the $P^-$-type diffusion regions 22A and 23A described above.

Next, an upper portion of each gate electrode 21 and each connection unit 25 is silicided, and the surface of each $P^+$-type diffusion region 22B and each $P^+$-type diffusion region 23B is silicided. Therefore, the silicide layer 21C and the silicide layer 25B are formed in the upper portion of each gate electrode 21 and each connection unit 25, respectively, and the silicide layer 22C and the silicide layer 23C are formed on the surface of each $P^+$-type diffusion region 22B and each $P^+$-type diffusion region 23B, respectively (refer to FIG. 5G). From above, the drive substrate 11 is obtained.

Figure 5H:
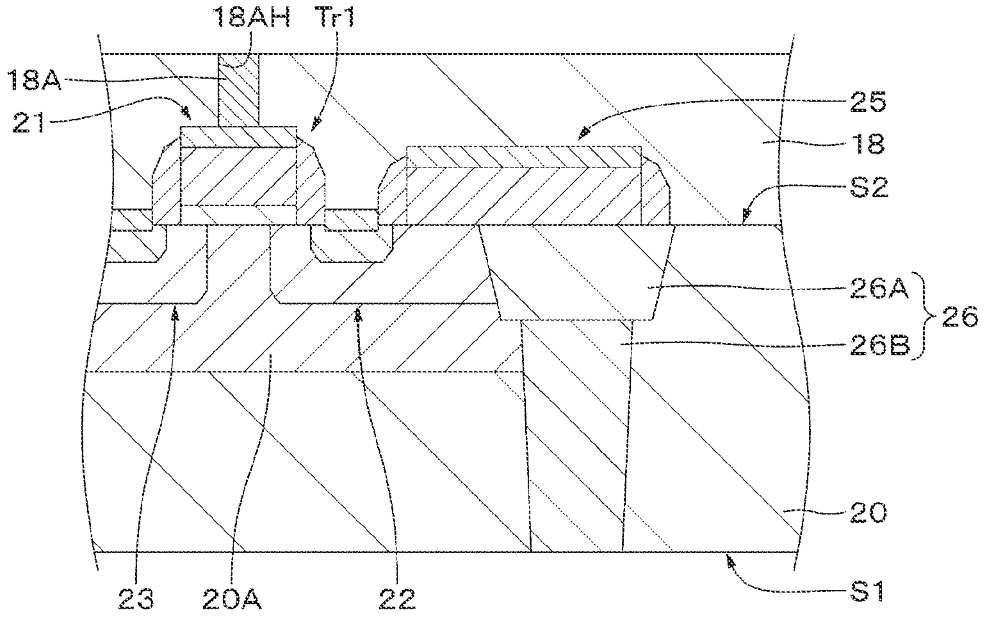
FIG. 5H is a step diagram for illustrating an example of the method of manufacturing the display device.
Figure 5I:
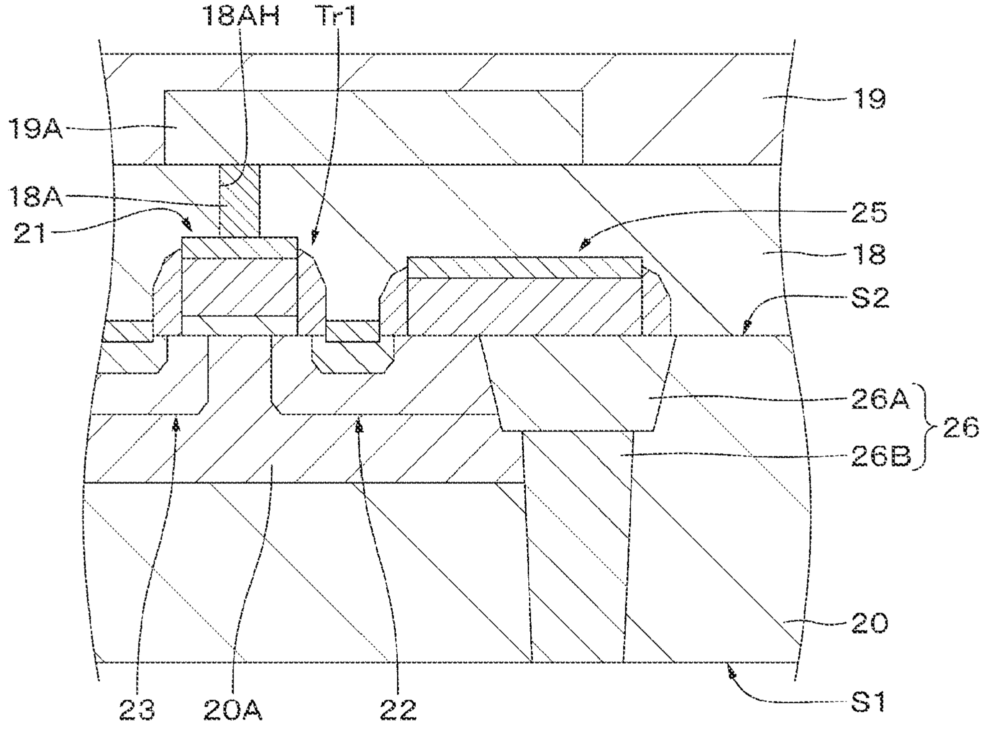
FIG. 5I is a step diagram for illustrating an example of the method of manufacturing the display device.

Next, after the insulating layer 18 is formed on the second surface S2 of the semiconductor substrate 20 by, for example, CVD, a surface of the insulating layer 18 is polished and flattened by, for example, chemical mechanical polishing (CMP) and the like. Next, after a contact hole 18AH is formed in the insulating layer 18 by, for example, photolithography and etching, a tungsten layer is formed on the insulating layer 18 by, for example, CVD, and the contact hole 18AH is filled with the tungsten layer. Next, the tungsten layer is polished by, for example, CMP and the like, and the tungsten layer other than that in the contact hole 18AH is removed. Therefore, the conductive plug 18A is formed in the contact hole 18AH (refer to FIG. 5H). Next, the multilayer wiring layer 19 including the wiring 19A is formed on the insulating layer 18 (refer to FIG. 5I). A configuration of the multilayer wiring layer 19 is selected according to a specification of a circuit to be used.

Figure 5J:
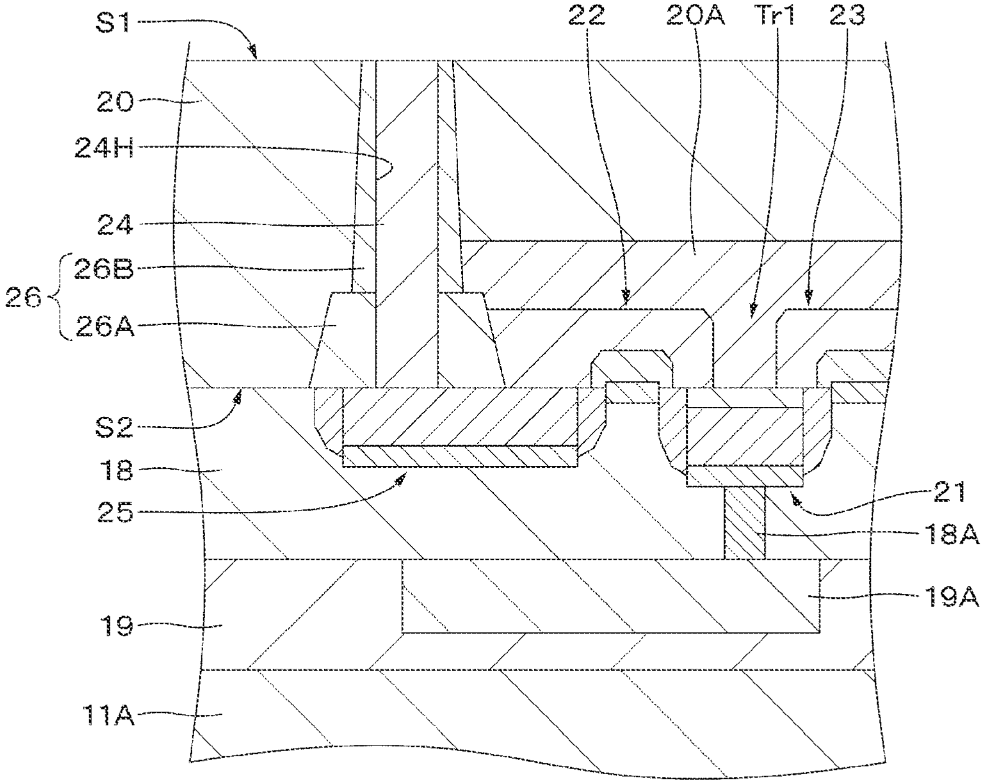
FIG. 5J is a step diagram for illustrating an example of the method of manufacturing the display device.

Next, the semiconductor substrate 20 is adjusted to have a desired thickness by bonding the support substrate 11A to the multilayer wiring layer 19, reversing the drive substrate 11 and the like together with the support substrate 11A, and then polishing the first surface S1 of the drive substrate 11 by, for example, CMP and the like. Next, the contact hole 24H that penetrates the semiconductor substrate 20 is formed in the isolation region 26 by, for example, dry etching. At that time, the connection unit 25 serves as the etching stopper layer. Thereafter, the contact hole 24H is filled with a conductive material, and the first surface S1 of the semiconductor substrate 20 is polished to be flattened by, for example, CMP. Therefore, the conductive plug 18A is formed in the contact hole 24H (refer to FIG. 5J).

Figure 5K:
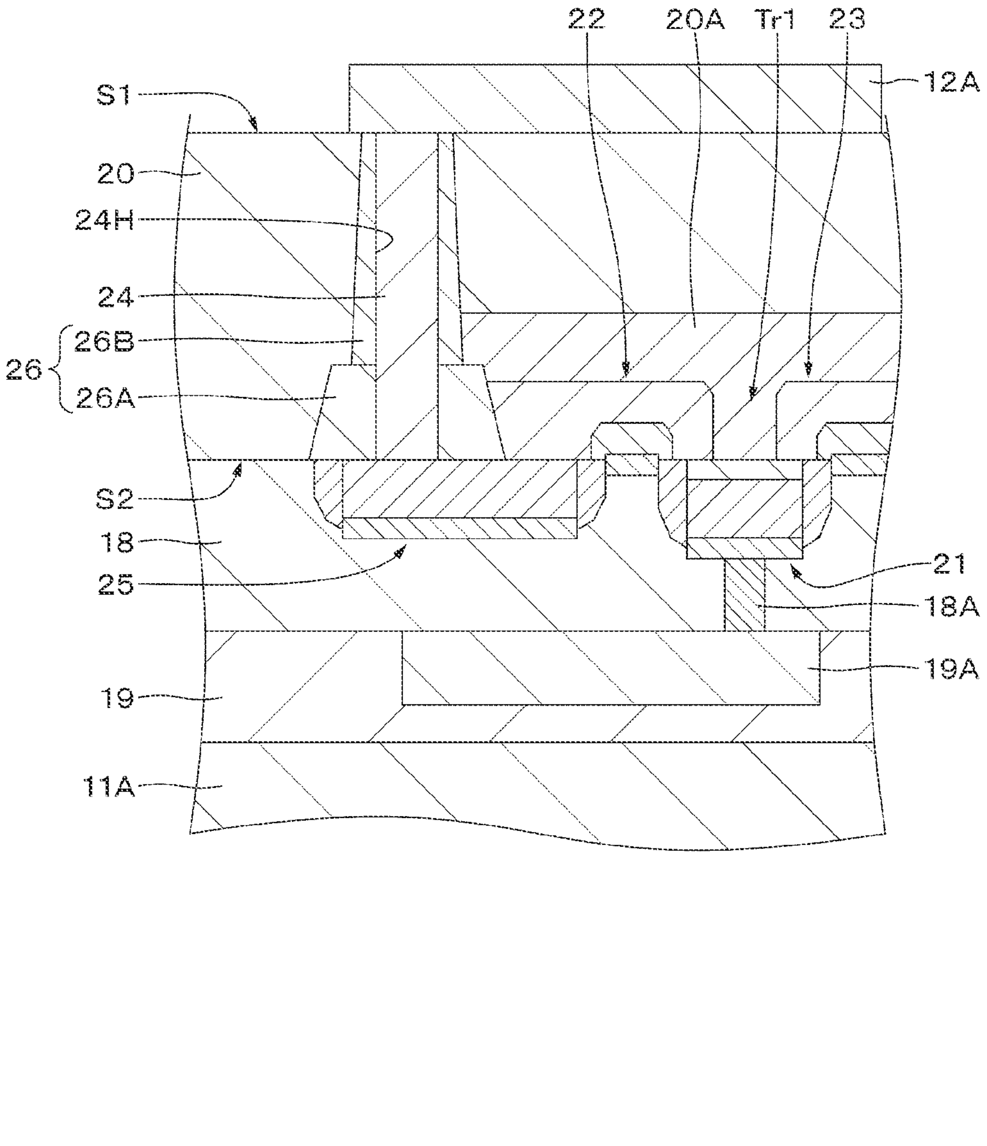
FIG. 5K is a step diagram for illustrating an example of the method of manufacturing the display device.

Next, after a metal layer is formed on the first surface S1 of the drive substrate 11 by, for example, sputtering, the metal layer is patterned using, for example, photolithography and etching to form a plurality of first electrodes 12A isolated for each light emitting element 12 (that is, for each subpixel 100) (refer to FIG. 5K).

Next, the insulating layer 13 is formed by, for example, CVD. Next, the insulating layer 13 is patterned using photolithography and etching. Next, the organic layer 12B is formed by stacking the hole injection layer, the hole transport layer, the light emitting layer, and the electron transport layer in this order on a plurality of first electrodes 12A and the insulating layer 13 by, for example, vapor deposition. Next, the second electrode 12C is formed on the organic layer 12B by, for example, sputtering. Therefore, a plurality of light emitting elements 12 is formed on the first surface S1 of the drive substrate 11.

Next, after the protective layer 14 is formed on the second electrode 12C by, for example, vapor deposition or CVD, the color filter 15 is formed on the protective layer 14 by, for example, photolithography. Note that, in order to flatten a step of the protective layer 14 and a step due to a film thickness difference of the color filter 15 itself, a flattening layer may be formed on, under, or both on and under the color filter 15. Next, after the color filter 15 is covered with the filling resin layer 16 by, for example, a one drop fill (ODF) method, the counter substrate 17 is placed on the filling resin layer 16. Next, for example, by applying heat to the filling resin layer 16 or irradiating the filling resin layer 16 with ultraviolet rays to cure the filling resin layer 16, the drive substrate 11 and the counter substrate 17 are bonded to each other via the filling resin layer 16. Therefore, the display device 10 is sealed. Note that, in a case where the filling resin layer 16 includes both the thermosetting resin and the ultraviolet curable resin, the filling resin layer 16 may be irradiated with ultraviolet rays to be temporarily cured, and then heat may be applied to the filling resin layer 16 to finally cure the same. From above, the display device 10 illustrated in FIG. 3 is obtained.

[1-3. Action and Effect]

Figure 6:
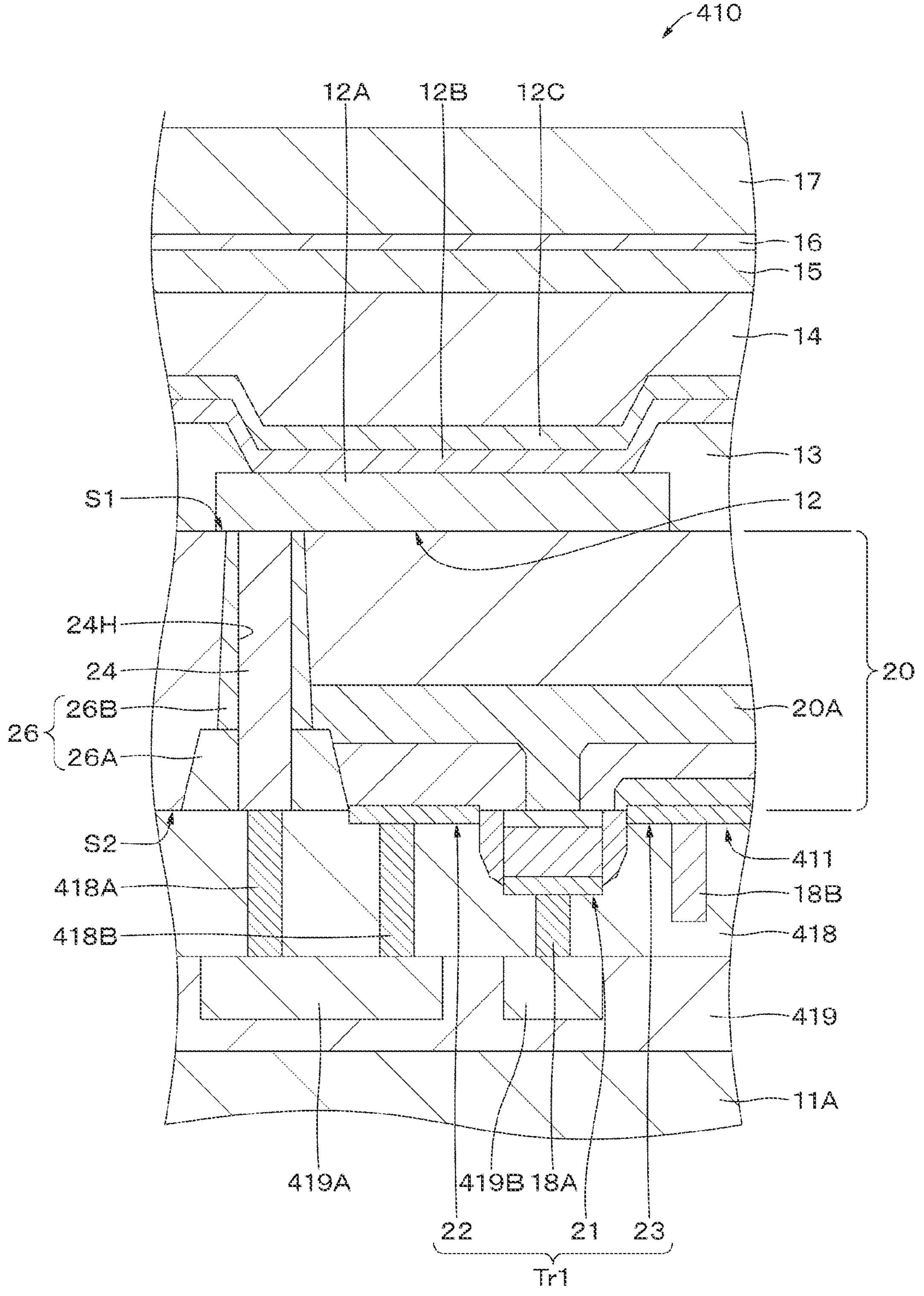
FIG. 6 is a cross-sectional view illustrating a configuration of a display device according to a reference example.

FIG. 6 is a cross-sectional view illustrating a configuration of a display device 410 according to a reference example. In a drive substrate 411 of the display device 410, a source/drain region (diffusion layer) 22 of the drive transistor Tr1 and the through electrode 24 are connected to each other by conductive plugs 418A and 418B of an insulating layer 418 and wiring 419A of a multilayer wiring layer 419. Therefore, a degree of freedom in routing wiring 419B and the like other than the wiring 419A included in the multilayer wiring layer 419 is decreased.

Furthermore, since minimum processing dimensions disadvantageous from the viewpoint of manufacturing yield are frequently used, a decrease in yield is likely to occur.

Furthermore, in a case where a voltage higher than a voltage (for example, 1.2 V or 3.3 V) used in a general LSI is applied to the first electrode 12A that drives the light emitting element 12 (often required in the liquid crystal element or the OLED element), the wiring 419A connected to the through electrode 24 needs to be separated from adjacent wiring 419B and the like more than others from the viewpoint of reliability, so that the degree of freedom in routing the wiring 419B and the like is decreased.

In contrast, as described above, in the drive substrate 11 of the display device 10 according to the first embodiment, the source/drain region (diffusion layer) 22 of the drive transistor Tr1 and the through electrode 24 are connected to each other by the connection unit 25. Therefore, the wiring 419A and the like of the reference example may be reduced. Therefore, in the display device 10 according to the first embodiment, the degree of freedom in routing the wiring 19A and the like included in the multilayer wiring layer 19 may be improved.

Furthermore, it is possible to effectively utilize a region obtained by reducing the wiring 419A. For example, the manufacturing yield of the display device 10 may be improved by thickening the wiring 19A and the like included in the multilayer wiring layer 19 or widening an inter-wiring space.

Furthermore, in a case where the through electrode 24 is overlapped with the connection unit 25 (that is, in a case of alignment) in the first embodiment, a degree of freedom in size, shape and the like of a pattern in which the through electrode 24 is overlapped (that is, the connection unit 25) may be improved as compared with a case where the through electrode 24 is overlapped with the conductive plug 418A in the reference example. Therefore, the manufacturing yield of the display device 10 may be improved, and variation in resistance between the source/drain region (diffusion layer) 22 and the through electrode 24 may be suppressed.

Furthermore, since use of the minimum processing dimensions disadvantageous from the viewpoint of manufacturing yield may be reduced, a decrease in yield may be suppressed.

Furthermore, since a space may be obtained in the multilayer wiring layer 19 by reducing the wiring 419A, the decrease in the degree of freedom in wiring routing may be suppressed even in a case where it is necessary to increase the inter-wiring space in the multilayer wiring layer 19 from the viewpoint of reliability as described above.

The drive substrate 11 is provided with the through electrode 24 in the isolation region 26 (that is, the first isolation region 26A and the second isolation region 26B). This makes it possible to suppress the leakage current flowing between the semiconductor substrate 20 and the through electrode 24.

The through electrode 24 is provided in the first isolation region 26A on the second surface S2 side of the semiconductor substrate 20. Therefore, an area in which the polysilicon layer 25A of the connection unit 25 is in contact with the semiconductor substrate 20 may be reduced. Therefore, it is possible to suppress the leakage current flowing between the semiconductor substrate 20 and the semiconductor substrate 20.

2. Second Embodiment

[2-1. Configuration of Display Device]

Figure 7:
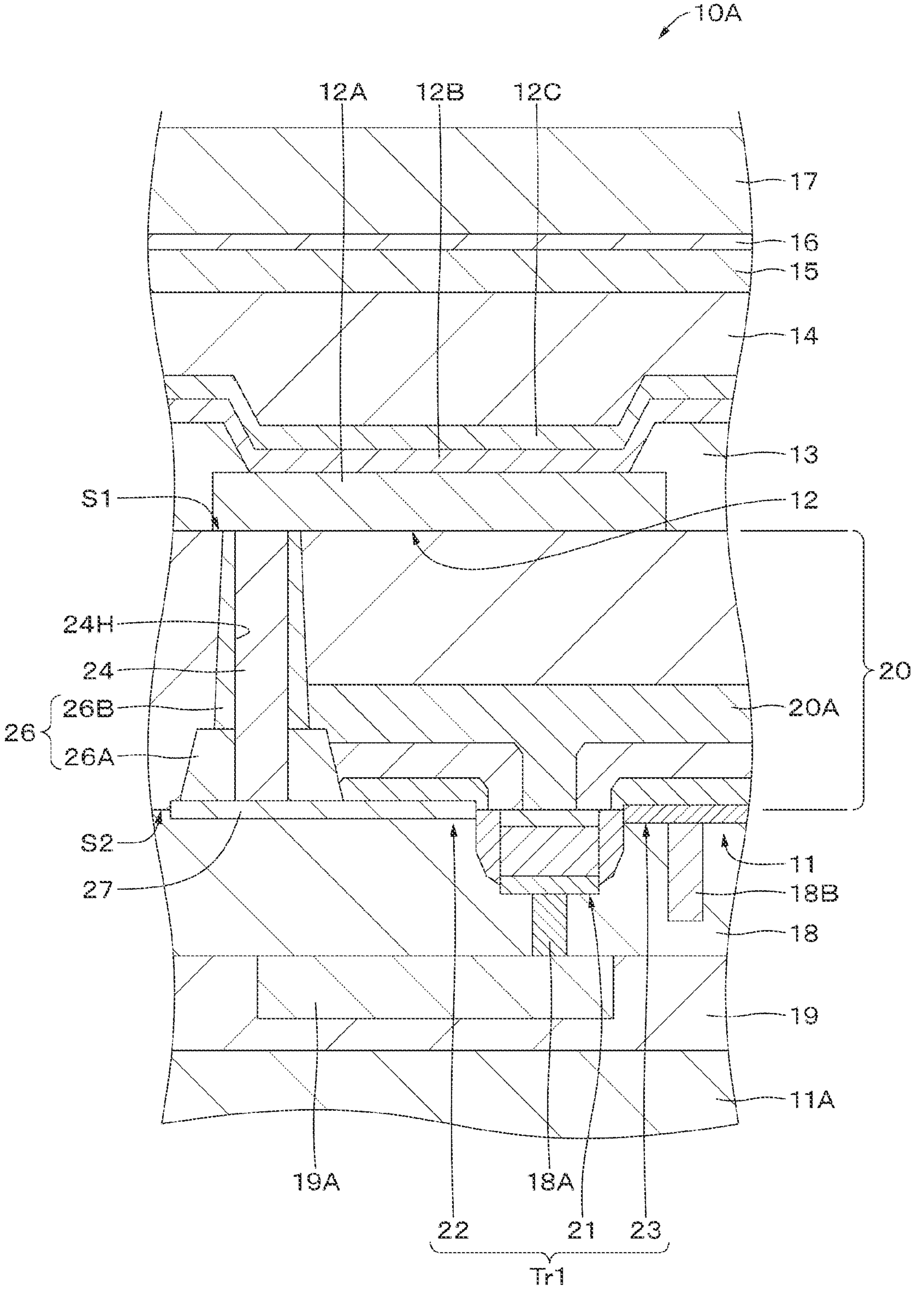
FIG. 7 is a cross-sectional view illustrating an example of a configuration of a display device according to a second embodiment of the present disclosure.

FIG. 7 is a schematic diagram illustrating an example of an entire configuration of a display device 10A according to a second embodiment of the present disclosure. The display device 10A according to the second embodiment is different from the display device 10 according to the first embodiment in that a connection unit 27 is provided in place of the connection unit 25 (refer to FIG. 3).

The connection unit 27 connects a source/drain region (diffusion layer) 22 of a drive transistor Tr1 and a through electrode 24 to each other as is the case with the connection unit 25. The connection unit 25 includes, for example, a silicide layer. The silicide layer is an example of a semiconductor compound layer. As a material of the silicide layer forming the connection unit 25, a material similar to that of a silicide layer 21C of a gate electrode 21 may be exemplified. The silicide layer forming the connection unit 27 may include a material similar to that of the silicide layer 21C of the gate electrode 21, or may include a material different from that of the silicide layer 21C of the gate electrode 21.

[2-2. Method of Manufacturing Display Device]

Hereinafter, an example of a method of manufacturing the display device 10A according to the second embodiment of the present disclosure is described with reference to FIGS. 5A, 5B, 8A, 8B, 8C, and 8D.

First, steps from formation of a second isolation region 26B (refer to FIG. 5A) to a forming step of a gate insulating layer 21A (refer to FIG. 5B) are performed similarly to the method of manufacturing the display device 10 according to the first embodiment. Next, a plurality of $P^-$-type diffusion regions 22B and a plurality of $P^-$-type diffusion regions 23B are formed by ion-implanting P-type impurities such as boron into each N-type well region 20A.

Figure 8A:
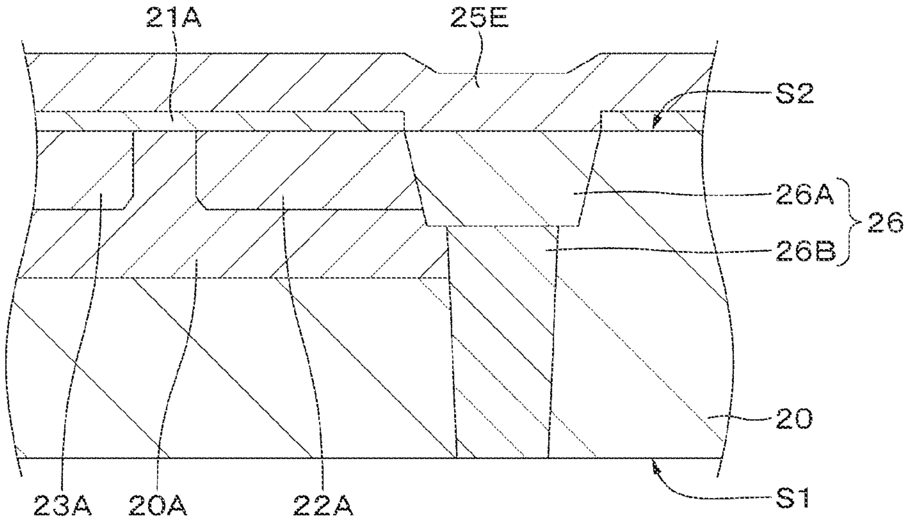
FIG. 8A is a step diagram for illustrating an example of a method of manufacturing the display device.
Figure 8B:
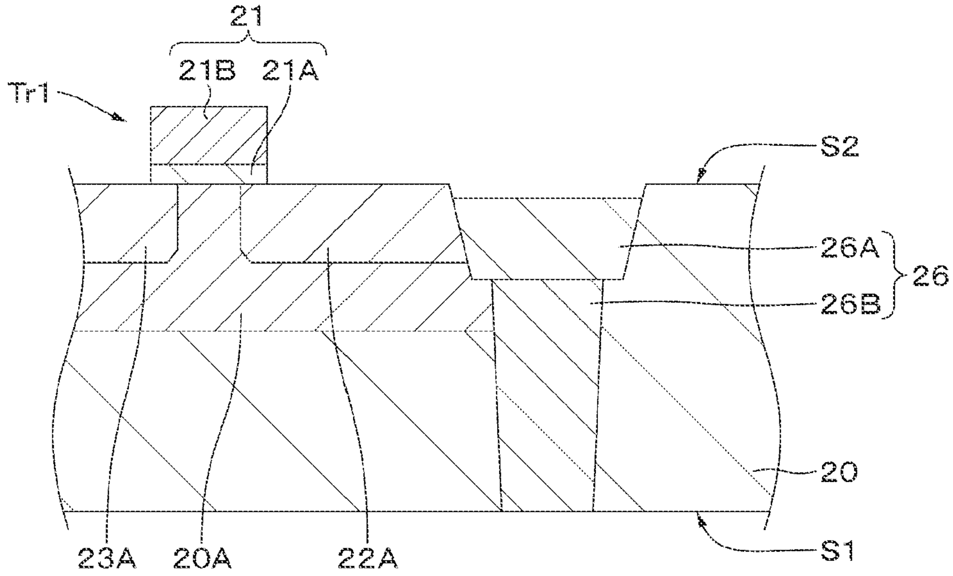
FIG. 8B is a step diagram for illustrating an example of the method of manufacturing the display device.

Next, a polysilicon layer 25E is formed on a second surface S2 of a semiconductor substrate 20 by, for example, CVD (refer to FIG. 8A). Next, the polysilicon layer 25E is patterned by, for example, photolithography and etching to form a plurality of gate electrodes 21 on the second surface S2 of the semiconductor substrate 20 (refer to FIG. 8B).

Figure 8C:
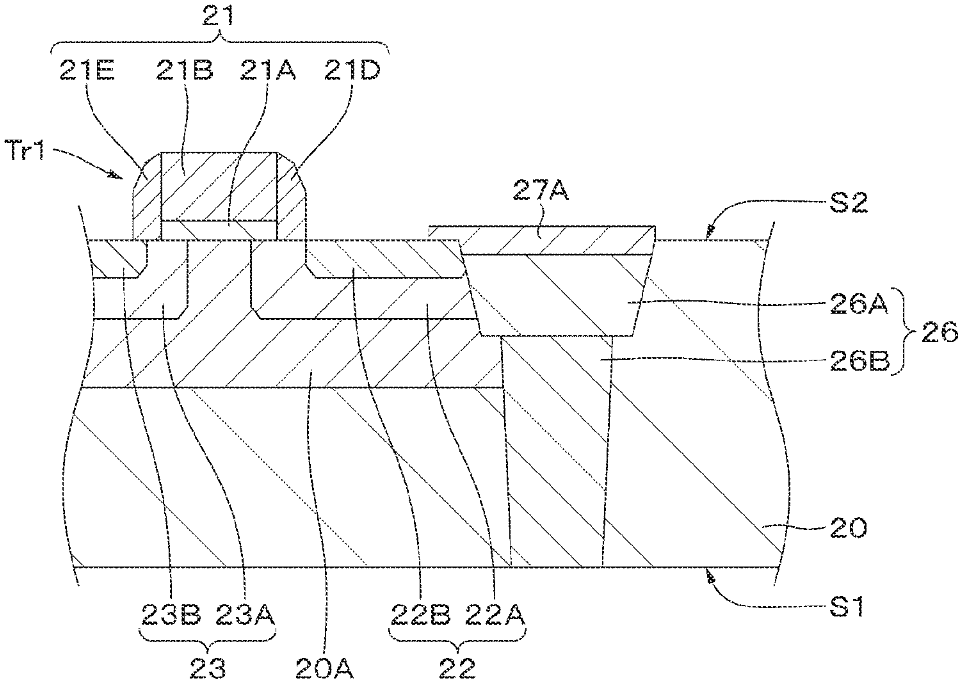
FIG. 8C is a step diagram for illustrating an example of the method of manufacturing the display device.

Next, after an oxide layer is formed on the semiconductor substrate 20 by, for example, CVD, the above-described oxide layer is etched back to form sidewalls 21D and 21E on each gate electrode 21 (refer to FIG. 8C). Next, after a polysilicon layer 27A is formed on the second surface S2 of the semiconductor substrate 20 by, for example, CVD, the polysilicon layer 27A is patterned by, for example, photolithography and etching, thereby leaving the polysilicon layer 27A on each isolation region 26.

Next, the P-type impurities such as boron are implanted into each polysilicon layer 21B, each polysilicon layer 27A, each $P^-$-type diffusion region 22A, and each $P^-$-type diffusion region 23A. Therefore, each polysilicon layer 21B and each polysilicon layer 27A become $P^+$-type polysilicon layers. Furthermore, the $P^+$-type diffusion region 22B and the $P^+$-type diffusion region 23B are formed in each $P^-$-type diffusion region 22A and each $P^-$-type diffusion region 23A, respectively.

Figure 8D:
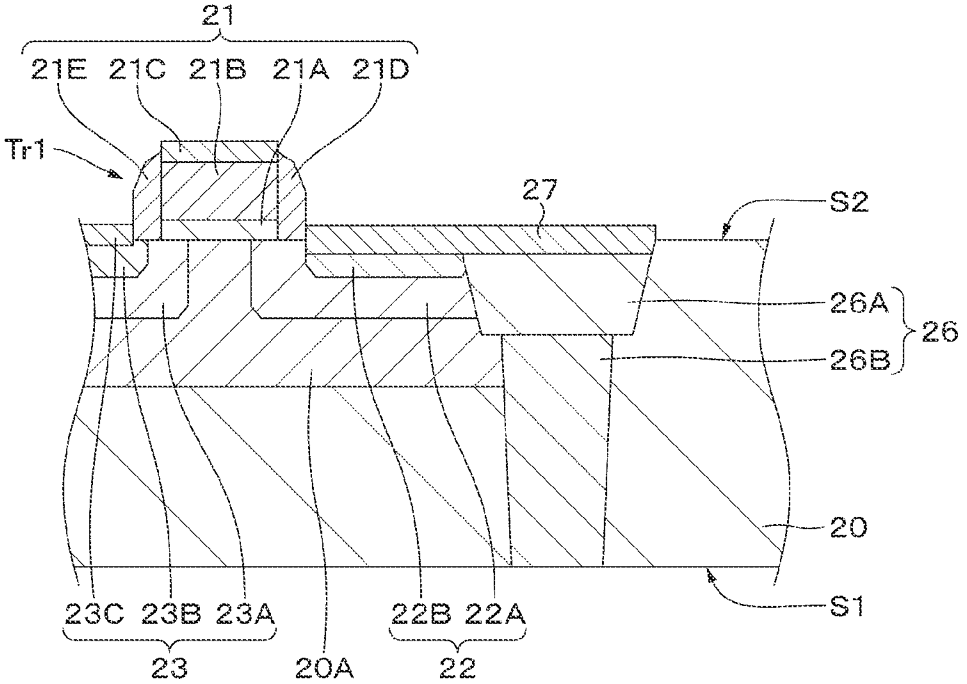
FIG. 8D is a step diagram for illustrating an example of the method of manufacturing the display device.

Next, an upper portion of each gate electrode 21, a surface of each $P^+$-type diffusion region 23B, a surface of each $P^+$-type diffusion region 22B, and an entire portion of each polysilicon layer 27A are silicided to form the silicide layer 21C, a silicide layer 23C, and the connection unit (silicide layer) 27 (refer to FIG. 8D). From above, the drive substrate 11 is obtained.

Next, steps after a step of forming the insulating layer 18 are performed as is the case with the method of manufacturing the display device 10 according to the first embodiment. From above, the display device 10A illustrated in FIG. 7 is obtained.

[2-3. Action and Effect]

As described above, in the drive substrate 11 of the display device 10A according to the second embodiment, the source/drain region (diffusion layer) 22 of the drive transistor Tr1 and the through electrode 24 are connected to each other by the connection unit 27 including the silicide layer. Therefore, parasitic resistance between the drive transistor Tr1 and the through electrode 24 may be reduced as compared with the display device 10 according to the first embodiment.

3. Variation (Variation 1)

Although the example in which the semiconductor substrate 20 is provided with the first isolation region 26A and the second isolation region 26B is described in the first and second embodiments described above, it is also possible that the semiconductor substrate 20 is not provided with the second isolation region 26B, or the first isolation region 26A and the second isolation region 26B.

(Variation 2)

Although the example in which an impurity concentration of the polysilicon layer 25A of the connection unit 25 is substantially similar to an impurity concentration of the polysilicon layer 21B of the drive transistor Tr1 is described in the above-described first embodiment, the impurity concentration of the polysilicon layer 25A of the connection unit 25 may be different from the impurity concentration of the polysilicon layer 21B of the drive transistor Tr1. For example, the impurity concentration of the polysilicon layer 25A of the connection unit 25 may be higher than the impurity concentration of the polysilicon layer 21B of the drive transistor Tr1. In this case, contact resistance between the polysilicon layer 25A of the connection unit 25 and the source/drain region 22 and contact resistance between the polysilicon layer 25A of the connection unit 25 and the through electrode 24 may be reduced. Furthermore, parasitic resistance between the drive transistor Tr1 and the through electrode 24 may be reduced.

(Variation 3)

Although the example in which the connection unit 25 is provided with the polysilicon layer 25A and the silicide layer 25B is described in the first embodiment described above, an entire connection unit 25 may include the silicide layer. In this case, parasitic resistance between the drive transistor Tr1 and the through electrode 24 may be reduced.

(Variation 4)

Although the example in which the gate electrode 21 is provided with the gate insulating layer 21A, the polysilicon layer 21B, and the silicide layer 21C is described in the first and second embodiments described above, the gate electrode 21 may be provided with the gate insulating layer 21A and the silicide layer 21C. In this case, parasitic resistance between the drive transistor Tr1 and the through electrode 24 may be reduced.

(Variation 5)

Although the example in which the drive substrate 11 has a configuration in which the pixel circuit 120 is formed on the semiconductor substrate 20 is described in the first and second embodiments described above, this may have a configuration in which the pixel circuit 120 is formed on a glass substrate.

(Variation 6)

Although the example in which the drive transistor Tr1 is the P-type MOSFET is described in the first and second embodiments described above, the drive transistor Tr1 may be an N-type MOSFET. Note that, in the first and second embodiments described above, the write transistor Tr2 may be a P-type MOSFET or an N-type MOSFET.

(Variation 7)

Although the example in which the light emitting element 12 is the OLED element and the like is described in the first and second embodiments described above, the light emitting element 12 may be a self-luminous light emitting element such as an inorganic electro-luminescence (IEL) element or a semiconductor laser element.

(Variation 8)

Although the example in which the silicide layer 22C is provided on the surface of the source/drain region (diffusion layer) 22 is described in the first embodiment described above, it is not required that the silicide layer 22C is provided on the surface of the source/drain region 22. That is, the surface of the source/drain region 22 may be non-silicide. In this case, the leakage current between the connection unit 25 and the N-type well region 20A may be suppressed.

(Variation 9)

Although the example in which the connection unit 25 is provided with the polysilicon layer 25A and the silicide layer 25B is described in the first embodiment described above, the connection unit 25 may be provided with a metal layer in place of the polysilicon layer 25A and the silicide layer 25B. Although the example in which the connection unit 27 includes the silicide layer is described in the second embodiment described above, the connection unit 25 may include a metal layer. The metal layer may include, for example, Ta, TaN, or Nb, or may include two metal layers of a WN layer and a $RuO_2$ layer.

The gate electrode 21 may be a metal gate electrode. Specifically, the gate electrode 21 may be provided with a metal layer in place of the polysilicon layer 21B. In a case where the gate electrode 21 is the metal gate electrode, the metal layer of the gate electrode 21 and the metal layers of the connection units 25 and 27 may include the same metal material or different metal materials. In a case where the drive transistor Tr1 is the P-type MOSFET, the metal layer of the gate electrode 21 includes, for example, Ta, TaN, or Nb. In a case where the drive transistor Tr1 is the N-type MOSFET, the metal layer of the gate electrode 21 includes, for example, two metal layers of the WN layer and the $RuO_2$ layer.

4. Application Example (Electronic Device)

Figure 9:
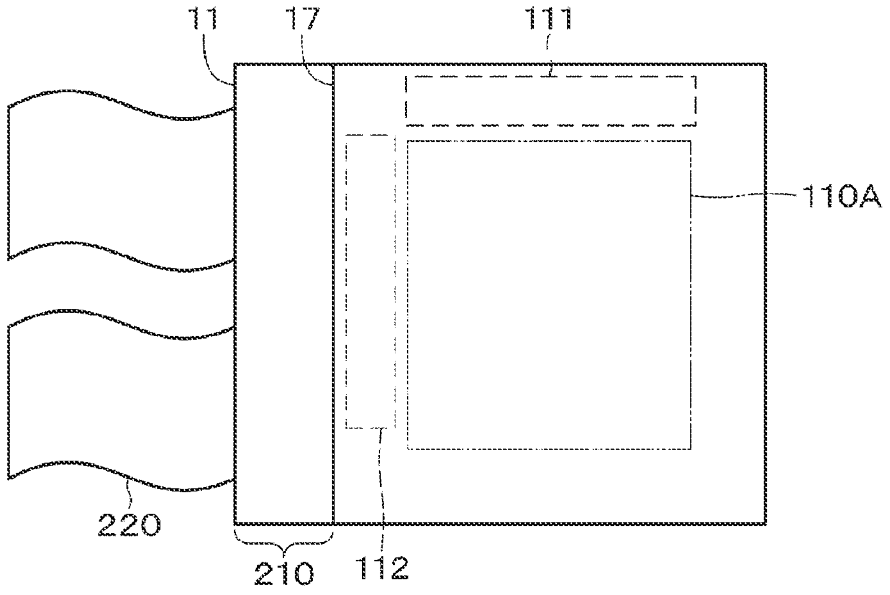
FIG. 9 is a plan view illustrating an example of a schematic configuration of a module.

The display device 10, 10A according to any of the first and second embodiments and the variations thereof described above is incorporated into various electronic devices as a module as illustrated in FIG. 9, for example. Especially, this is suitable for an electronic view finder of a video camera or a single-lens reflex camera, a head mounted display or the like in which high resolution is required, used for enlarging near the eyes. This module includes a region 210 exposed without being covered with a counter substrate and the like on one short side of a drive substrate 11, and external connection terminals (not illustrated) are formed in this region 210 by extending wiring of the signal line drive circuit 111 and the scanning line drive circuit 112. A flexible printed circuit (FPC) 220 for inputting and outputting signals may be connected to the external connection terminals.

Specific Example 1

Figure 10A:
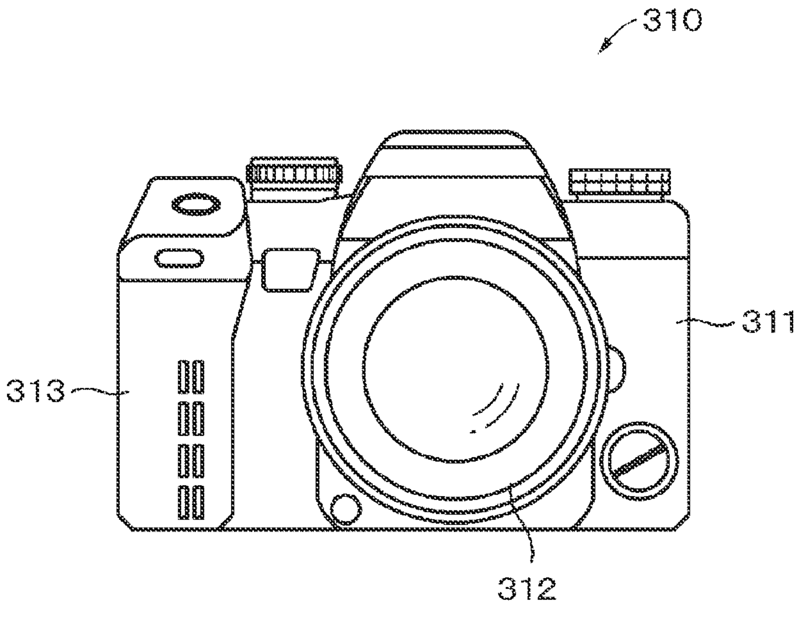
FIG. 10A is a front view illustrating an example of an external appearance of a digital still camera.
Figure 10B:
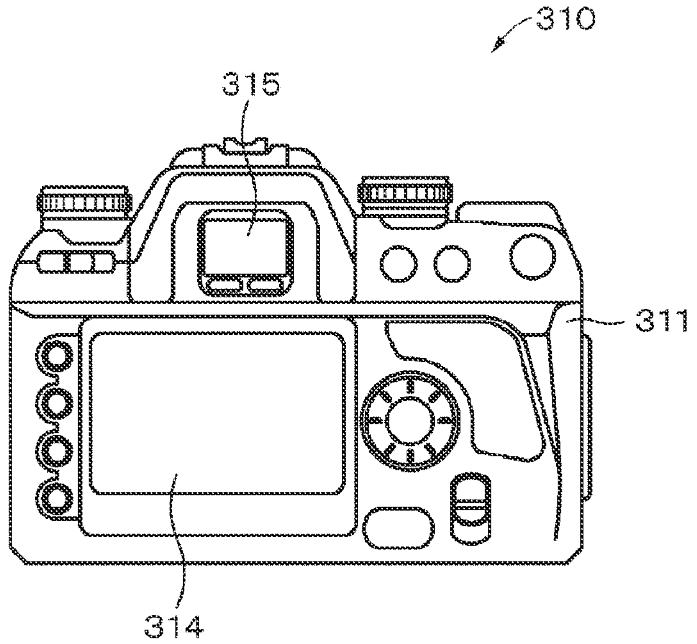
FIG. 10B is a rear view illustrating an example of the external appearance of the digital still camera.

FIGS. 10A and 10B illustrate an example of an external appearance of a digital still camera 310. The digital still camera 310 is of a lens interchangeable single-lens reflex type, and includes an interchangeable imaging lens unit (interchangeable lens) 312 on substantially the center of a front surface of a camera main body (camera body) 311, and a grip 313 to be held by a photographer on a front left side.

A monitor 314 is provided in a position displaced leftward from the center of a rear surface of the camera main body 311. An electronic view finder (eyepiece window) 315 is provided above the monitor 314. By looking into the electronic view finder 315, the photographer may determine a composition by visually recognizing an optical image of a subject guided from the imaging lens unit 312. As the electronic view finder 315, the display device 10, 10A according to any one of the first and second embodiments and the variations thereof described above may be used.

Specific Example 2

Figure 11:
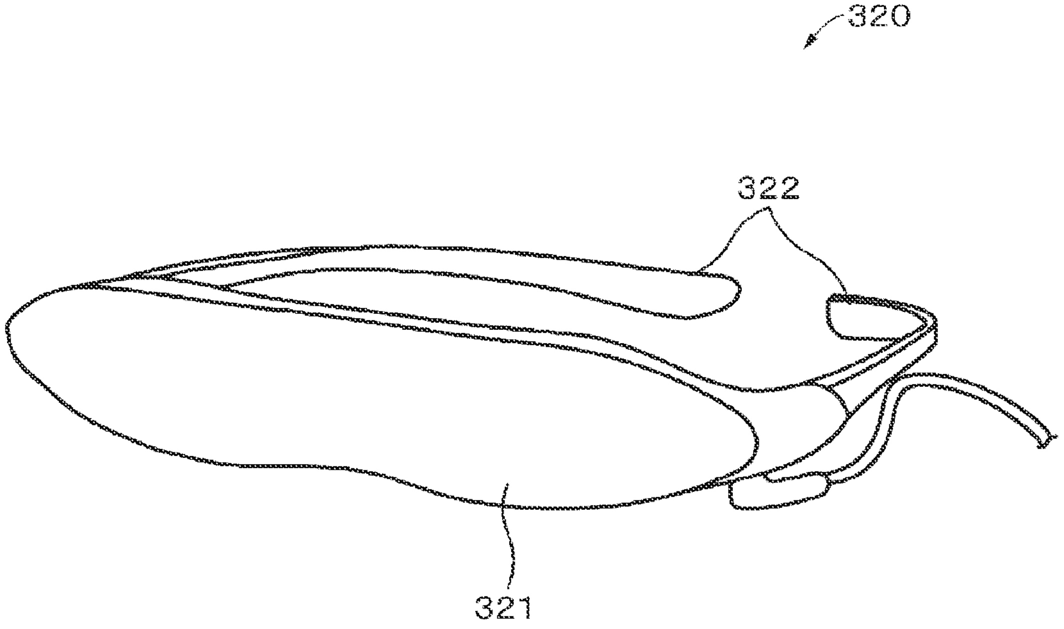
FIG. 11 is a perspective view illustrating an example of an external view of a head mounted display.

FIG. 11 illustrates an example of an external view of a head mounted display 320. The head mounted display 320 includes, for example, an ear hook 322 to be worn on the head of the user on both sides of a glass-shaped display unit 321. As the display unit 321, the display device 10, 10A according to any one of the first and second embodiments and the variations thereof described above may be used.

Specific Example 3

Figure 12:
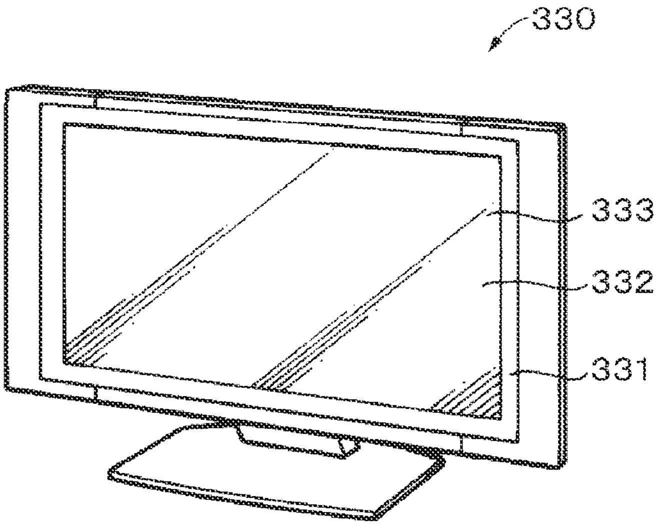
FIG. 12 is a perspective view illustrating an example of an external appearance of a television device.

FIG. 12 illustrates an example of an external appearance of a television device 330. The television device 330 includes, for example, a video display screen unit 331 including a front panel 332 and a filter glass 333, and the video display screen unit 331 includes the display device 10, 10A according to any one of the first and second embodiments and the variations thereof described above.

Although the first and second embodiments and the variations thereof of the present disclosure are specifically described above, the present disclosure is not limited to the first and second embodiments and the variations thereof described above, and various modifications based on the technical idea of the present disclosure may be made.

For example, the configuration, method, step, shape, material, numerical value and the like described in the first and second embodiments and the variations thereof described above are merely examples, and the configuration, method, step, shape, material, numerical value and the like different from those may also be used as necessary.

The configuration, method, step, shape, material, numerical value and the like of the first and second embodiments and the variations thereof described above may be combined with one another within the gist of the present disclosure.

The materials exemplified in the first and second embodiments and the variations thereof described above may be used alone or in combination of two or more unless otherwise specified.

Furthermore, the present disclosure may also adopt the following configurations.

(1)

A display device provided with:

a drive substrate including a first surface and a second surface; and a plurality of light emitting elements provided on the first surface, in which the drive substrate is provided with:

a plurality of drive transistors provided on the second surface and drives the plurality of light emitting elements, respectively;

a plurality of through electrodes that penetrates between the first surface and the second surface; and a plurality of connection units provided on the second surface, each of which connects a diffusion layer of each of the drive transistors and each of the through electrodes to each other, and the connection unit is provided with a semiconductor layer or a semiconductor compound layer.

(2)

The display device according to (1), in which the semiconductor layer is a polysilicon layer, and the semiconductor compound layer is a silicide layer.

(3)

The display device according to (1) or (2), in which the connection unit is further provided with a semiconductor compound layer provided on the semiconductor layer.

(4)

The display device according to (3), in which the semiconductor layer is a polysilicon layer, and the semiconductor compound layer is a silicide layer.

(5)

The display device according to any one of (1) to (4), in which a surface of the diffusion layer is non-silicide.

(6)

The display device according to any one of (1) to (5), in which the connection unit is provided with a first polysilicon layer, a gate electrode of the drive transistor is provided with a second polysilicon layer, and the first polysilicon layer and the second polysilicon layer include a same material.

(7)

The display device according to any one of (1) to (5), in which the connection unit is provided with a first polysilicon layer, a gate electrode of the drive transistor is provided with a second polysilicon layer, and the first polysilicon layer and the second polysilicon layer include different materials.

(8)

The display device according to any one of (1) to (7), in which the drive substrate is provided with an isolation region that isolates the through electrode from a semiconductor substrate, which is a main body of the drive substrate.

(9)

The display device according to any one of (1) to (8), in which the through electrode includes tungsten.

(10)

The display device according to any one of (1) to (8), in which the through electrode includes polysilicon.

(11)

The display device according to any one of (1) to (8), in which the through electrode includes single crystal silicon.

(12)

The display device according to any one of (1) to (9), in which a light emitting element is an organic light emitting diode element.

(13)

The display device according to any one of (1) to (12), in which the drive substrate is provided with a pixel circuit that corrects a threshold voltage Vth of the drive transistor and controls light emission of a light emitting element, and the pixel circuit is provided with the drive transistor, a signal write transistor, and a capacitive element.

(14)

The display device according to any one of (1) to (13), in which a channel of the drive transistor includes single crystal silicon.

(15)

An electronic device provided with:

the display device according to any one of (1) to (14).

REFERENCE SIGNS LIST

10, 10A, 410 Display device
11, 411 Drive substrate
11A Support substrate
12 Light emitting element
12A First electrode
12B Organic layer
12C Second electrode
13 Insulating layer
14 Protective layer
15 Color filter
16 Filling resin layer
17 Counter substrate
18, 418 Insulating layer
18A, 18B, 418A, 418B Conductive plug

19, 419 Multilayer wiring layer
19A, 419A, 419B Wiring
20 Semiconductor substrate
20A N-type semiconductor well region
21 Gate electrode
21A Gate insulating film
21B Polysilicon layer
21C Silicide layer
21D, 21E Sidewall
22, 23 Source/drain region (diffusion layer)
22A, 23A $P^-$-type diffusion region
22B, 23B $P^+$-type diffusion region
22C, 23C Polysilicon layer
24 Through electrode
25, 27 Connection unit
25A Polysilicon layer (semiconductor layer)
25B Silicide layer (semiconductor compound layer)
25C, 25D Sidewall
26 Isolation region
26A First isolation region
26B Second isolation region
100R, 100G, 100B Subpixel
110A Display region
110B Peripheral region
111 Signal line drive circuit
111A Signal line
112 Scanning line drive circuit
112A Scanning line
310 Digital still camera (electronic device)
320 Head mounted display (electronic device)
330 Television device (electronic device)
Cs Capacitive element
S1 First surface
S2 Second surface
Tr1 Drive transistor
Tr2 Write transistor

The invention claimed is:

1. A display device, comprising:
a drive substrate including a first surface and a second surface; and
a plurality of light emitting elements on the first surface, wherein
the drive substrate further includes:
a semiconductor substrate that is a main body of the drive substrate;
a plurality of drive transistors on the second surface, wherein the plurality of drive transistors is configured to drive a plurality of the light emitting elements, respectively;
a plurality of through electrodes that penetrates between the first surface and the second surface;
an isolation region that isolates a through electrode of the plurality of through electrodes from the semiconductor substrate; and
a plurality of connection units on the second surface, wherein each of the plurality of connection units connects a diffusion layer of each of the plurality of drive transistors with each of the plurality of through electrodes, and
each connection unit of the plurality of connection units includes a semiconductor layer and a semiconductor compound layer.

2. The display device according to claim 1, wherein
the semiconductor layer is a polysilicon layer, and
the semiconductor compound layer is a silicide layer.

3. The display device according to claim 1, wherein
the semiconductor compound layer is on the semiconductor layer.

4. The display device according to claim 3, wherein
the semiconductor layer is a polysilicon layer, and
the semiconductor compound layer is a silicide layer.

5. The display device according to claim 1, wherein a surface of the diffusion layer is non-silicide.

6. The display device according to claim 1, wherein
each of the plurality of connection units further includes a first polysilicon layer,
a gate electrode of each of the plurality of drive transistors includes a second polysilicon layer, and
the first polysilicon layer and the second polysilicon layer include a same material.

7. The display device according to claim 1, wherein
each of the plurality of connection units further includes a first polysilicon layer,
a gate electrode of each of the plurality of drive transistors includes a second polysilicon layer, and
the first polysilicon layer includes a material different from a material of the second polysilicon layer.

8. The display device according to claim 1, wherein the through electrode includes tungsten.

9. The display device according to claim 1, wherein the through electrode includes polysilicon.

10. The display device according to claim 1, wherein the through electrode includes single crystal silicon.

11. The display device according to claim 1, wherein each of the plurality of light emitting elements is an organic light emitting diode element.

12. The display device according to claim 1, wherein
the drive substrate further includes a pixel circuit,
the pixel circuit includes a drive transistor of the plurality of drive transistors, a signal write transistor, and a capacitive element, and
the pixel circuit is configured to:
correct a threshold voltage Vth of the drive transistor; and
control light emission of a light emitting element of the plurality of light emitting elements.

13. The display device according to claim 1, wherein a channel of each of the plurality of drive transistors includes single crystal silicon.

14. An electronic device comprising:
the display device according to claim 1.

15. A display device, comprising:
a drive substrate that includes a first surface and a second surface; and
a plurality of light emitting elements on the first surface, wherein
the drive substrate further includes:
a semiconductor substrate that is a main body of the drive substrate;
a plurality of drive transistors on the second surface, wherein the plurality of drive transistors is configured to drive a plurality of the light emitting elements, respectively;
a plurality of through electrodes that penetrates between the first surface and the second surface;
an isolation region that isolates a through electrode of the plurality of through electrodes from the semiconductor substrate; and
a plurality of connection units on the second surface, wherein each of the plurality of connection units connects a diffusion layer of each of the plurality of drive transistors with each of the plurality of through electrodes, and a connection unit of the plurality of connection units includes a semiconductor layer or a semiconductor compound layer.

* * * * *